US008712711B2

(12) United States Patent
Nayar et al.

(10) Patent No.: US 8,712,711 B2
(45) Date of Patent: Apr. 29, 2014

(54) IDENTIFICATION OF ELECTRICAL GRID PHASE INFORMATION FOR END-POINTS IN A GRID NETWORK

(75) Inventors: Nitin Nayar, San Jose, CA (US); Jeffrey D. Taft, Washington, PA (US); Navindra Yadav, Cupertino, CA (US)

(73) Assignee: Cisco Technology, Inc., San Jose, CA (US)

(*) Notice: Subject to any disclaimer, the term of this patent is extended or adjusted under 35 U.S.C. 154(b) by 340 days.

(21) Appl. No.: 13/187,765

(22) Filed: Jul. 21, 2011

(65) Prior Publication Data

US 2013/0024149 A1  Jan. 24, 2013

(51) Int. Cl.
*G06F 19/00* (2011.01)
*G01R 25/00* (2006.01)
*G01R 29/18* (2006.01)
*H02J 13/00* (2006.01)
*H02J 3/26* (2006.01)

(52) U.S. Cl.
CPC .............. *G01R 29/18* (2013.01); *H02J 13/0013* (2013.01); *H02J 3/26* (2013.01); *Y02E 40/50* (2013.01); *Y04S 40/12* (2013.01)
USPC .................. 702/72; 324/66; 324/86; 702/122

(58) Field of Classification Search
CPC ........ G01R 29/18; H02J 3/26; H02J 13/0013; H02J 13/0048; Y02E 40/50; Y02E 60/7807; Y04S 40/12
USPC ............ 702/61, 72, 79, 89, 106, 122; 324/66, 324/86, 142; 327/116, 153, 276; 329/304, 329/306; 375/142, 362; 455/67.15
See application file for complete search history.

(56) References Cited

U.S. PATENT DOCUMENTS

| 5,822,383 A | 10/1998 | Muntz et al. |
| 6,229,359 B1 | 5/2001 | Chesavage |
| 6,434,185 B1 | 8/2002 | Struhsaker et al. |

(Continued)

FOREIGN PATENT DOCUMENTS

WO   WO-2013006273 A2   1/2013

OTHER PUBLICATIONS

Owen Electric Cooperative, Case #2006-00314, http://www.psc.ky.gov/PSCSCF/2006%20cases/2006-00314/OwenElectric_Response_080406.pdf, Sep. 2005 through Aug. 2006.

(Continued)

*Primary Examiner* — John H Le
(74) *Attorney, Agent, or Firm* — Edwards Wildman Palmer LLP; James M. Behmke; Jonathon P. Western

(57) ABSTRACT

In one embodiment, a requesting device (e.g., head-end application) requests a phase-related response from an end-point that does not know its phase in a polyphase power source system. In response, the requesting device receives the phase-related response from the end-point, where the response relays an identification of the end-point and related phase information without indicating an actual phase of the end-point, e.g., on which power-line is a response generated or at which time is a zero-crossing of the power source's waveform. The phase information of the phase-related response may then be correlated to a known phase of a known-phase device, such that the actual phase of the end-point may be identified based on the correlation.

21 Claims, 23 Drawing Sheets

(56) References Cited

U.S. PATENT DOCUMENTS

| | | |
|---|---|---|
| 6,518,811 B1 | 2/2003 | Klecka, III |
| 6,549,046 B1 | 4/2003 | Klecka, III |
| 6,750,687 B1 | 6/2004 | Klecka, III |
| 6,877,121 B1 | 4/2005 | Srinivasaiah et al. |
| 7,921,307 B2 | 4/2011 | Karam et al. |
| 8,207,726 B2 * | 6/2012 | Vaswani et al. ............. 324/66 |
| 2004/0263147 A1 | 12/2004 | Piesinger |
| 2007/0249366 A1 | 10/2007 | Thomson et al. |
| 2009/0010190 A1 | 1/2009 | Gong |
| 2010/0060259 A1 | 3/2010 | Vaswani et al. |
| 2010/0262393 A1 | 10/2010 | Sharma et al. |

OTHER PUBLICATIONS

Roche J., "AMI Investments Enable Efficiency, Productivity and Service Quality Improvements," Electric Light & Power, Nov. 1, 2009.

Kauko, et al., "Notification of Transmittal of the International Search Report and the Written Opinion of the International Searching Authority, or the Declaration", Patent Cooperation Treaty, Mar. 7, 2013, 10 pages, PCT/US2012/047624, European Patent Office, Rijswijk, Netherlands.

* cited by examiner

| KNOWN-PHASE DEVICES 905 | KNOWN PHASE 910 | UNKNOWN-PHASE DEVICES 915 (CONNECTED VIA KNOWN-PHASE DEVICES) |
|---|---|---|
| I | L1 | i, iii, vii |
| II | L2 | iv, v, ix |
| III | L3 | ii, vi |
| IV | L3 | viii, x |

TABLE 900

CORRELATION

FIG. 9

| KNOWN-PHASE DEVICES 1020 | KNOWN-PHASE DEVICES 905 | KNOWN PHASE 910 | UNKNOWN-PHASE DEVICES 915 (CONNECTED VIA KNOWN-PHASE DEVICES) |
|---|---|---|---|
| AA | I | L1 | i |
|  |  |  | iii |
|  |  |  | vii |
| BB | II | L2 | iv |
|  |  |  | v |
|  |  |  | ix |
| CC | III | L3 | ii |
|  |  |  | vi |
|  | IV | L3 | viii |
|  |  |  | x |

TABLE 1000

FIG. 10

| END-POINT 1205 | KNOWN/DETERMINED PHASE 1207 | END-POINT LOCATION 1210 | END-POINT LOCATION 1212 | END-POINT LOCATION 1215 |
|---|---|---|---|---|
| 120a | L1 | 1 | 2 | 170b |
| 120b | L2 | 2 | 1 | 170a |
| 120c | L2 | 3 | 4 | 170d |
| ... | ... | ... | ... | ... |

TABLE 1200

CORRELATION

FIG. 12

| KNOWN-PHASE DEVICES 1505 | KNOWN PHASE 1510 | ZERO-CROSSING TIMING 1515 | ZERO-CROSSING TIMING 1520 | UNKNOWN-PHASE END-POINTS 1525 |
|---|---|---|---|---|
| I | L1 | T1 | T1 | i |
| | | | T3 | ii |
| II | L2 | T2 | T1 | iii |
| | | | T2 | iv |
| | | | T2 | v |
| III | L3 | T3 | T1 | vi |
| | | | T3 | vii |
| | | | T2 | viii |
| | | | T3 | ix |
| ... | ... | ... | ... | x |
| | | | | ... |

TABLE 1500

CORRELATION

IDENTIFY AS PHASE "L1"

FIG. 15

IDENTIFICATION OF ELECTRICAL GRID PHASE INFORMATION FOR END-POINTS IN A GRID NETWORK

TECHNICAL FIELD

The present disclosure relates generally to electrical grids, and, more particularly, to phase identification of devices in electrical grids.

BACKGROUND

Electric power is generally transmitted from generation plants to end users (industries, corporations, homeowners, etc.) via a transmission and distribution grid consisting of a network of power stations, transmission circuits, and substations interconnected by power-lines. Once at the end users, electricity can be used to power any number of devices. The transfer of alternating-current (AC) electric power to the end users most frequently takes the form of three-phase electric power, where three current waveforms are produced that are generally equal in magnitude and 120° out of phase to each other. If the load on a three-phase system is balanced equally among the phases, no current flows through a neutral point, which is an important design aspect of the electric grid, allowing for efficient use of transformer capacity, reduced materials (e.g., size of a neutral conductor), etc. However, there are many factors that may create imbalance between the phases, such as excess load usage, downed power-lines, etc.

The topology of the electric transmission grid typically considers the balancing of the three-phase system, such that each end user (and thus the end user's devices) is attached to the grid on a particular phase of the three phase distribution feeder (though certain customers may be connected to two or three phases of the feeder). Most often, however, the end users, and more specifically the end users' devices, are unaware of which phase they are operating upon.

In addition, distribution utility companies can benefit from having accurate distribution feeder (medium voltage/low voltage or "MV/LV" circuit) connectivity information in their software applications and data stores. This is especially useful for outage management and for convenient application to planning, construction, operations, and maintenance. It is, however, very challenging to try to construct or approximate the circuit model within a GIS environment due to the complexity of modeling the dynamic nature of an electrical network. While the utility may have an "as-built" database, it may differ from the actual grid for various reasons, including inaccurate or incomplete data capture on construction, and changes to circuits that are not reflected in updates to the database. In addition, circuit topology may change dynamically as feeder switches are operated in the course of either normal or emergency operations. Such changes result in an "as-operated" topology that is dynamic and is not reflected in the "as-built" database. The information on "as-operated" configurations may not be available to smart grid systems at a latency low enough for real time operation of smart grid applications.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 9 illustrates an example correlation table for identifying end-point phase;

FIG. 10 illustrates an example hierarchical mapping based on the correlation table for identifying end-point phase;

FIG. 12 illustrates an example correlation of locations for identifying phase of non-communicating power devices;

FIG. 15 illustrates another example correlation table for identifying end-point phase;

DESCRIPTION OF EXAMPLE EMBODIMENTS

Overview

Figure 1:
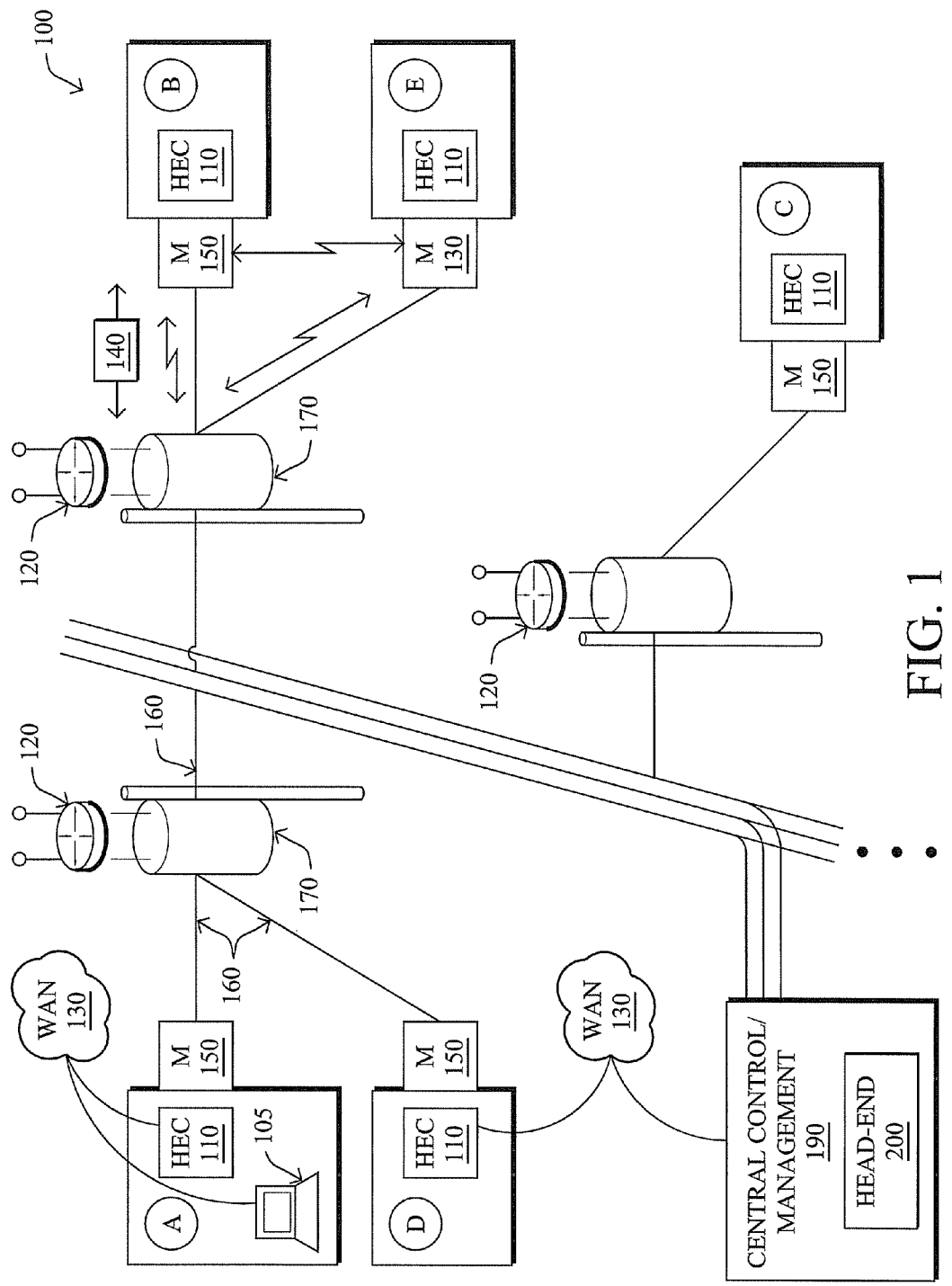
FIG. 1 illustrates an example network of devices shown with various communication and powering configurations.

According to one or more embodiments of the disclosure, a requesting device (e.g., head-end application) requests a phase-related response from an end-point that does not know its phase in a polyphase power source system. In response, the requesting device receives the phase-related response from the end-point, where the response relays an identification of the end-point and related phase information without indicating an actual phase of the end-point. The phase information of the phase-related response may then be correlated to a known phase of a known-phase device, such that the actual phase of the end-point may be identified based on the correlation. In one illustrative embodiment, the phase-related response is a message transmitted on a particular power-line of the polyphase power source system, and the related phase information of the phase-related response being the fact that the message was transmitted on the particular power-line, while in another illustrative embodiment, the related phase information within the phase-related response is a timestamp corresponding to zero-crossing timing of a particular power-line of the polyphase power source system on which the end-point is located.

Description

A computer network is a geographically distributed collection of nodes interconnected by communication links and segments for transporting data between end nodes, such as personal computers and workstations, or other devices, such as sensors, utility meters, etc. Many types of networks are available, with the types ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC) such as IEEE 61334, IEEE P1901.2, and others. In addition, a Mobile Ad-Hoc Network (MANET) is a kind of wireless ad-hoc network, which is generally considered a self-configuring network of mobile routes (and associated hosts) connected by wireless links, the union of which forms an arbitrary topology.

Smart object networks, in particular, are a specific type of network having spatially distributed autonomous devices such as sensors, actuators, etc. For example, sensor networks, such as for "Smart Grid" and "Smart Cities" (e.g., for Advanced Metering Infrastructure or "AMI" applications), may cooperatively monitor physical or environmental conditions at different locations, such as, e.g., energy/power consumption, resource consumption, etc. Another type of smart object includes actuators, e.g., responsible for turning on/off an engine or perform any other actions. Generally, smart object networks may include any type of device that is able to communicate information on a computer network, such as household appliances (air conditioners, refrigerators, lights, etc.), industrial devices (heating, ventilating, and air conditioning (HVAC), pumps, motors, etc.), and other "smart" devices.

That is, smart object networks are typically interconnected by a communication network, such as a wireless network, though wired connections are also available, and may often consist of wireless nodes in communication within a field area network (FAN). For instance, each smart device (node) in a smart object network may generally be equipped with a radio transceiver or other communication port, a microcontroller, and an energy source, such as a battery (or, in particular to the embodiments herein, a distribution grid power source). Typically, size and cost constraints on sensor nodes result in corresponding constraints on resources such as energy, memory, computational power and bandwidth. Correspondingly, a reactive routing protocol may, though need not, be used in place of a proactive routing protocol for sensor networks.

FIG. 1 is a schematic block diagram of an example simplified network 100 of devices illustratively comprising various communicating and non-communicating devices. For example, power-lines 160 may bring electrical grid power from respective transformers 170 into homes/businesses/etc., generally via a meter 150. In addition, "pole-top" routers 120 may communicate data packets 140 (e.g., traffic and/or messages) with other communicating nodes/devices of the network 100. For instance, the links between the devices may be wired links (e.g., for power-line communication) or may comprise a wireless communication medium. A home energy controller (HEC) 110 or other energy controller may be present at certain locations, and may be in communication with the meters 150, pole-top routers 120, or else directly to another computer network, e.g., WAN 130, similar to conventional computers 105. In addition, a centralized control center or management center 190 may be present in the network 100, such as at an electrical grid company's centralized location, and may be in communication over power-lines 160 and through WAN 130.

Those skilled in the art will understand that any number of nodes, devices, links, etc., as well as any different (and suitable) type of nodes, devices, links, etc., may be present in the network, and that the view shown herein is for simplicity and is not meant to limit the scope of the embodiments herein. In fact, those skilled in the art will appreciate that countless arrangements of power grid components and communicating devices may be established.

Figure 2:
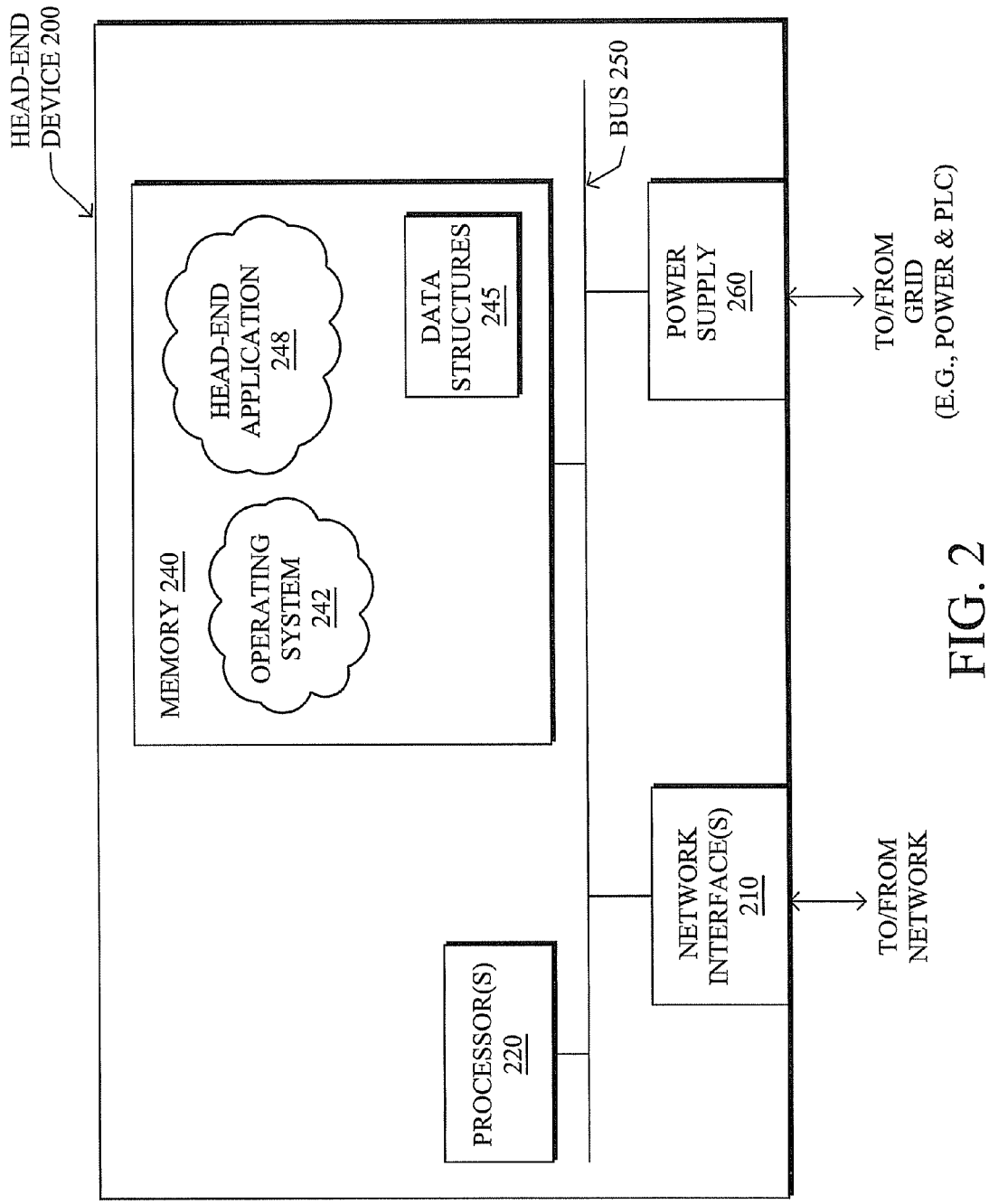
FIG. 2 illustrates an example management device/node.

FIG. 2 is a schematic block diagram of an example device 200 that may be used with one or more embodiments described herein, e.g., as a head-end device (or application) within the central management center 190. For example, the head-end device 200 may be a computerized device configured as a utility company's connectivity mapping head-end, or other types of geographic information systems (GIS) application device. The device 200 may comprise, as a simple representation, a network interface 210, a processor 220, and a memory 240 interconnected by a system bus 250.

The network interface 210 contains the mechanical, electrical, and signaling circuitry for communicating data over physical and/or wireless links coupled to the network 100. The network interface may be configured to transmit and/or receive data using a variety of different communication protocols, including, inter alia, various wired or wireless protocols, powerline communication (PLC) protocols, broadband over power lines (BPL), etc.

The memory 240 comprises a plurality of storage locations that are addressable by the processor 220 for storing software programs and data structures associated with the embodiments described herein. The processor 220 may comprise necessary elements or logic adapted to execute the software programs and manipulate the data structures 245. An operating system 242, portions of which are typically resident in memory 240 and executed by the processor, functionally organizes the device by, inter alia, invoking operations in support of software processes and/or services executing on the device. These software processes and/or services may comprise an illustrative head-end application process 248, for use as described herein, as well as other processes not shown for clarity.

Figure 3:
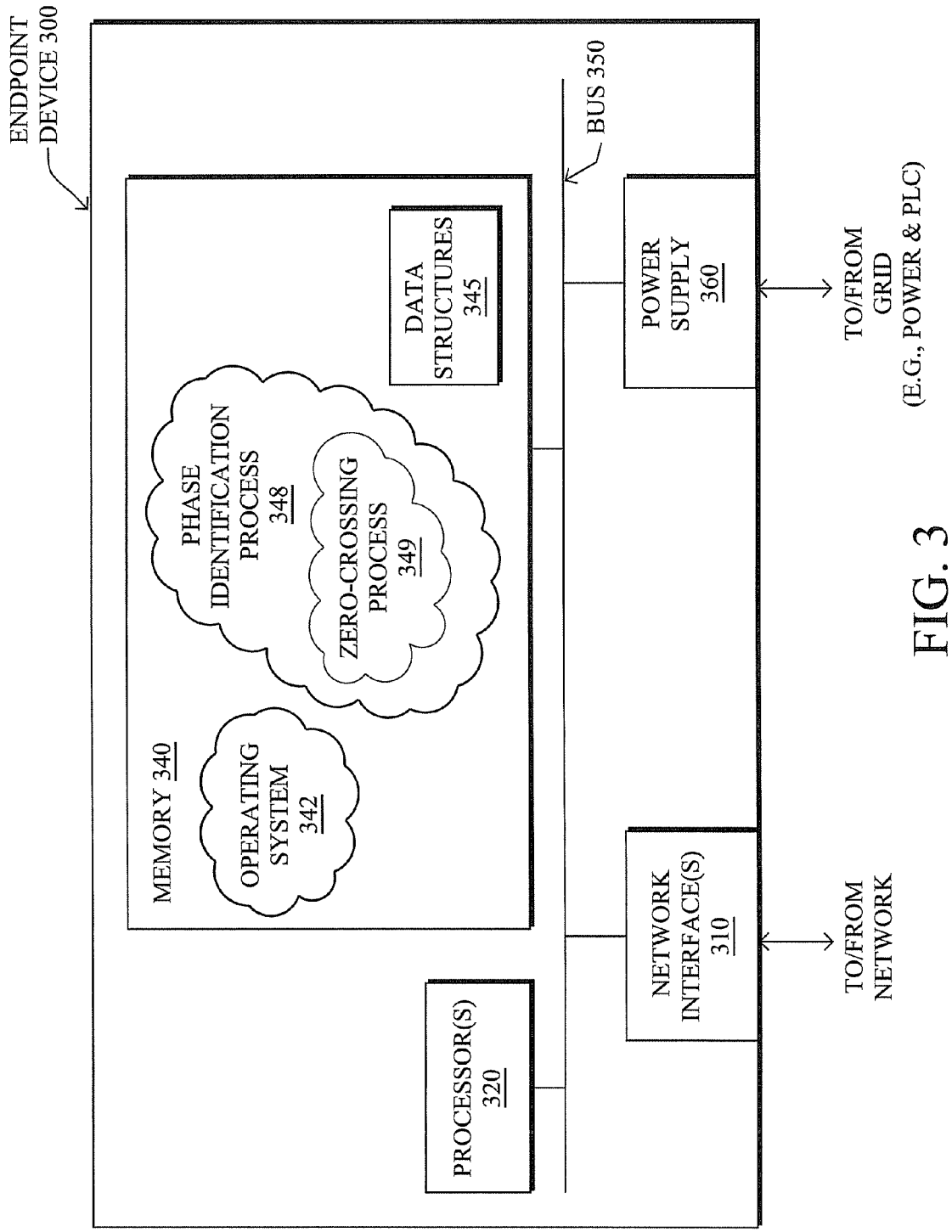
FIG. 3 illustrates an example end-point device/node.

Also, FIG. 3 is a schematic block diagram of an example device 300 that may be used with one or more embodiments described herein, e.g., as an "end-point" device, such as computers 105, HECs 110, smart meters 150, in certain cases routers 120, etc. Other example end-point devices may include, e.g., routers (with PLC) at feeder devices such as controllers, sensors (e.g., MV/LV sensors on MV feeders or laterals), HVAC controllers, specifically dedicated devices (e.g., utility company technician tools that plug into home sockets, or that can be installed near or within meters 150), etc.

The end-point device 300 may also comprise a network interface 310, a processor 320, and a memory 340 interconnected by a system bus 350. Notably, the device may also be powered by a power supply 360, such as a battery, or, more specifically with regard to one or more embodiments herein, a "plug-in" power supply. Within an endpoint device, memory 340 comprises a plurality of storage locations that are addressable by the processor 320 for storing software programs and data structures 345 associated with the embodiments described herein. Notably, certain devices may have limited memory or no memory (e.g., no memory for storage other than for programs/processes operating on the device). An operating system 342 may invoke operations in support of software processes and/or services executing on the device, such as an illustrative "end-point phase ID" application 348, and optionally (in certain embodiments) a zero-crossing process 349.

As noted above, electric power is generally transmitted from generation plants to end users (industries, commercial, residential, etc.) via a transmission grid consisting of a network of power stations, transmission circuits, and substations interconnected by power lines. From the transmission grid, power may then be distributed to end users via a distribution system. Once at the end users, electricity can be used to power any number of devices, such as end-point devices 300. The transmission and distribution of alternating-current (AC) electric power to the end users most frequently takes the form of polyphase electric power, a common form of which being three-phase electric power. For smaller customers (e.g., households) usually a single phase is taken to the property. For larger installations (large houses, buildings), all three phases may be taken to a distribution panel, from which both single and multi (two or three-phase) circuits may be fed.

Figure 4:
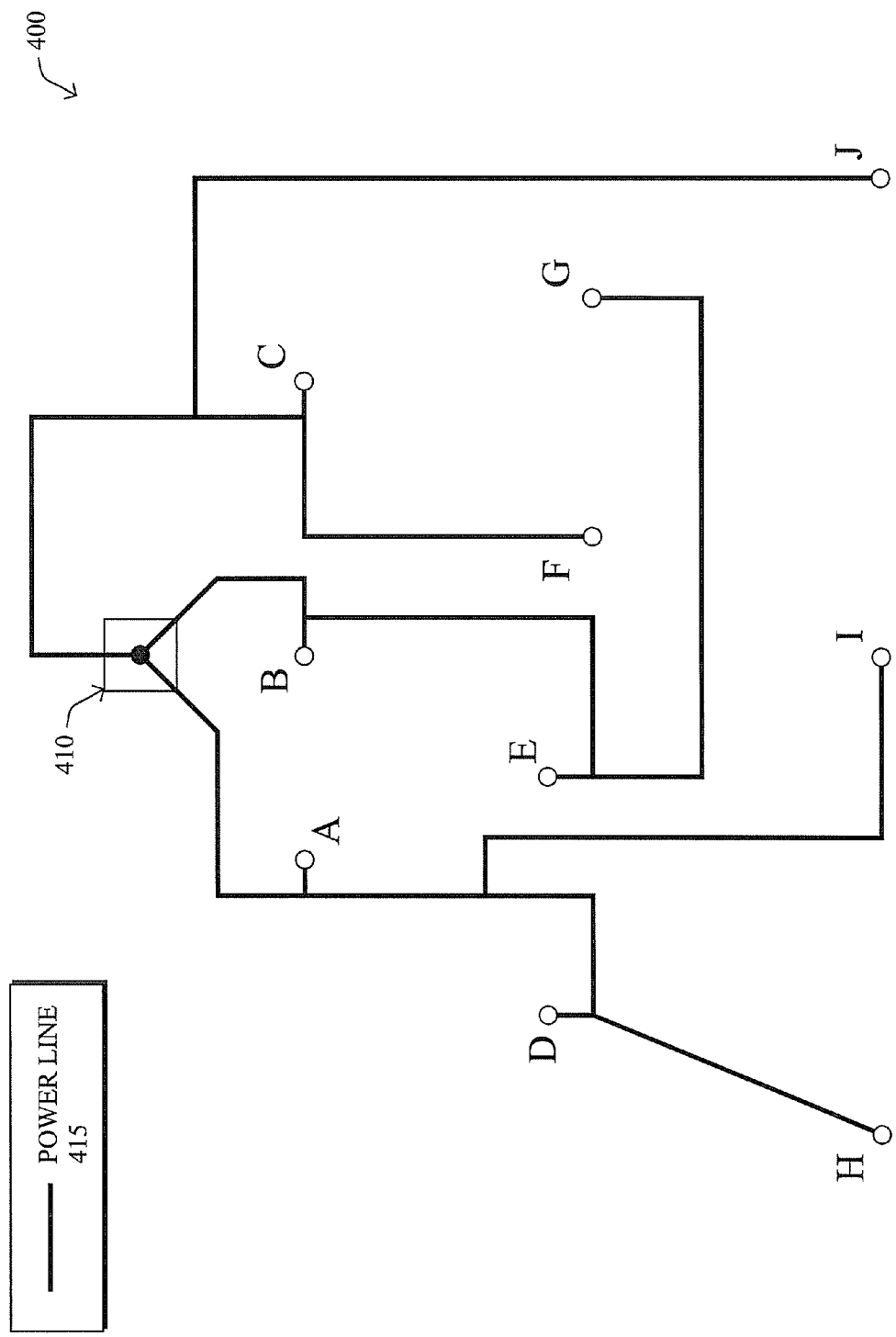
FIG. 4 illustrates an example electric distribution system.

FIG. 4 illustrates a vastly simplified view of an example electric power transmission and distribution grid 400 to the example devices of FIG. 1, above. For instance, a distribution center 410 supplies electricity over a plurality of power lines 415 (e.g., power-lines 160) to the devices at locations "A" through "J".

Figure 5:
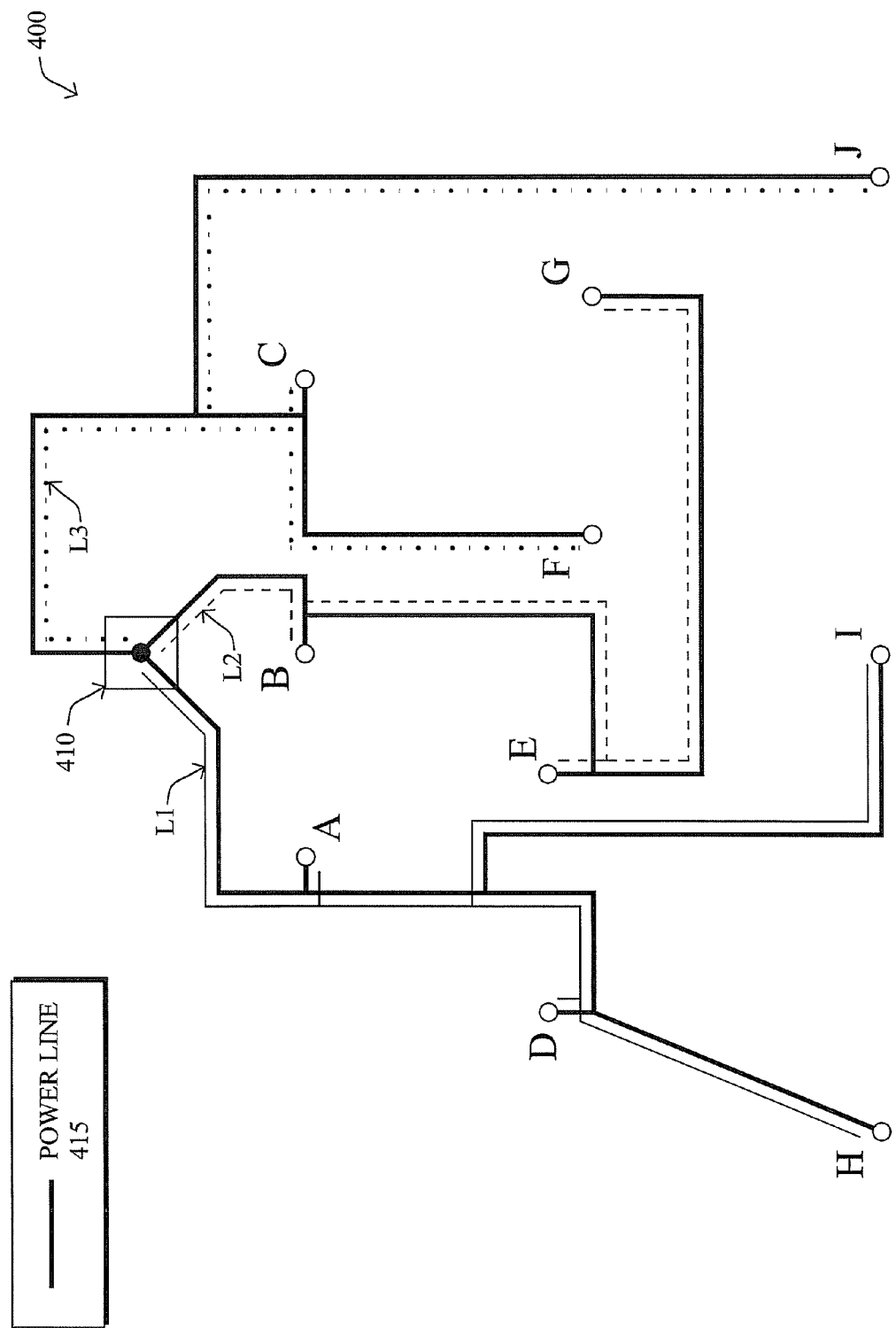
FIG. 5 illustrates an example polyphase electric distribution if the system shown in FIG. 4.

In the embodiments herein, the supplied electricity is part of a polyphase source system, where a plurality of phases (e.g., three) are transmitted onto the lines 415 to the devices, such that each device is generally attached to a particular phase of the electric grid. As shown in FIG. 5, therefore, electrical power of three phases, L1, L2, and L3, is supplied to the locations A-J (a neutral/ground may be shared by the phases). Notably, as mentioned above, the view shown herein is vastly simplified, as each phase may generally be used to power entire buildings, neighborhoods, etc, and may also supply power to many (e.g., tens, hundreds, thousands) of devices within those establishments. Also, while the view shown herein is generally arbitrarily connected, phase-based distribution grid topologies generally result in "clusters" of like-phased devices (e.g., those within the buildings, neighborhoods, etc.).

Figure 6B:
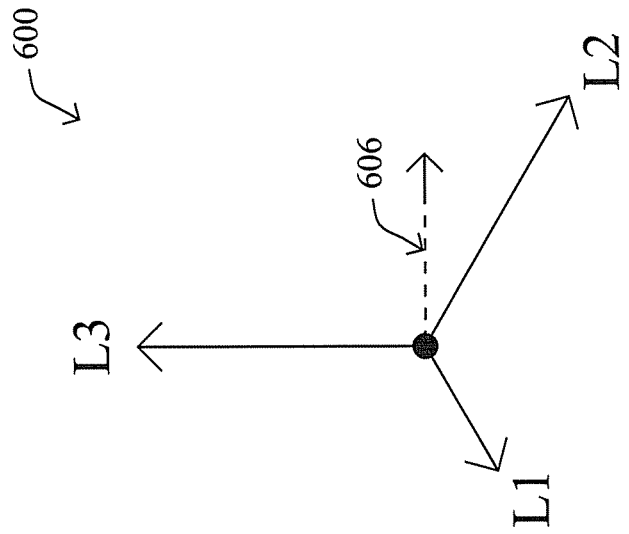
FIGS. 6A-B illustrate example phase representations of the polyphase electric distribution system.
Figure 6A:
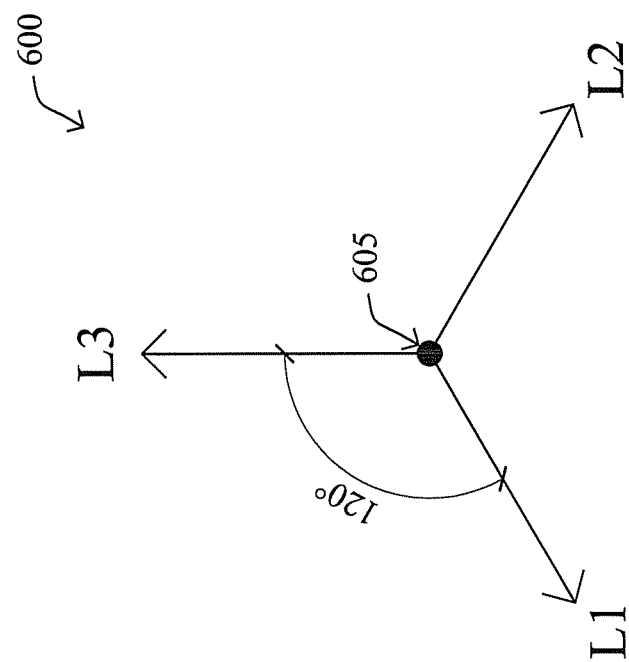

FIG. 6A illustrates an example phase representation 600 of the distribution grid's electrical power. In particular, three current waveforms are illustratively produced (L1, L2, and L3) that are generally equal in magnitude and 120° out of phase to each other. The currents returning from the end users to the supply transformer all share the neutral wire (neutral point 605). If the loads are evenly distributed on all three phases, as they are in FIG. 6A, the sum of the returning currents in the neutral wire is approximately zero. Any unbalanced phase loading such as in FIG. 6B, however, may result in a current 606 at the neutral point, which may cause inefficient use of transformers, vibrations in generators, or other problems, including (but not limited to) brown-outs or black-outs in extreme cases. There are many factors that may create imbalance between the phases, such as excess load usage, downed power lines, etc.

The topology of the electric distribution grid typically considers the approximate balancing of the three-phase system, such that each end user (and thus the end user's devices) is attached to the grid via a particular phase's current waveform. Most often, however, the end users, and more specifically the end users' devices, are unaware of which phase they are operating upon.

In addition, as further noted above, distribution utility companies can benefit from having accurate distribution feeder (medium voltage/low voltage or "MV/LV" circuit) connectivity information in their software applications and data stores. This is especially useful for geographic information systems (GIS) and outage management systems for convenient application to planning, construction, operations, and maintenance. It is, however, very challenging to try to construct or approximate the circuit model within a GIS environment due to the complexity of modeling the dynamic nature of an electrical network. For instance, though the utility companies may be (and often are not) aware of an "as-built" grid topology based on installing power-lines and connecting end-users, due to various reconstructions, alterations, power restorations, etc., end-users may be transitioned to different phases, resulting in an often vastly different "as-is" or "as-operated" grid topology.

As a particular example, a GIS representation of an electric distribution network (grid) does not inherently create or maintain the connectivity information necessary for electric distribution circuit analysis. This problem is compounded by the fact that an electric distribution network involves very complex connections between and among three different phase conductors and sometimes a fourth neutral conductor for thousands of miles of lines and tens of thousands of devices and other pieces of equipment. Even the most detailed representation of an electric distribution network in GIS rarely if ever fully represents these multiple phases, much less the actual connections of the equipment and devices. In addition, while it is generally convenient to make changes or additions to the physical items represented in the GIS, it is nearly impossible to develop the logic and algorithms necessary to translate such a change into the electric distribution network connectivity necessary for circuit analysis.

Moreover, the planning and analysis of an electric distribution network usually involves many different scenarios that involve trying various configurations and connections of existing facilities as well as the addition of new elements and nodes to serve new customers, accommodate changes in consumption patterns by existing customers, improve reliability, or upgrade or replace existing facilities. These are only theoretical at the time of analysis, and so will not be included in any GIS representations of the physical system. It would actually be an inefficient use of time and effort to reflect the theoretical scenarios in the GIS until the necessary capacity and configuration of the new elements and nodes are finalized in an approved system expansion and translated into completed projects. In utility parlance, they shouldn't become part of the GIS representation unless and until they are completed and the representation should be a correct representation of the "as-built" system.

Phase Identification of End-Point Devices

The techniques herein allow a utility to poll phase information for different end-points like customers, sensors, and pole-top routers and transformers using two illustrative mechanisms. For example, in a first embodiment, the end-point reports its identification over the power-line 160, hence providing phase information by correlating the phase of a receiver on that same power-line (same phase connection) with known phase information. In a second embodiment, the phase information is extracted based on zero-crossing timestamps (voltage waveform), which are compared with the timestamps of devices with known phases. Note that both techniques may also utilize out-of-band (OOB) signaling mechanisms.

Specifically, according to one or more embodiments of the disclosure as described in greater detail below, a requesting device (e.g., head-end application) requests a phase-related response from an end-point that does not know its phase in a polyphase power source system. In response, the requesting device receives the phase-related response from the end-point, where the response relays an identification of the end-point and related phase information without indicating an actual phase of the end-point. The phase information of the phase-related response may then be correlated to a known phase of a known-phase device, such that the actual phase of the end-point may be identified based on the correlation. In one illustrative embodiment, the phase-related response is a message transmitted on a particular power-line of the polyphase power source system, and the related phase information of the phase-related response being the fact that the message was transmitted on the particular power-line, while in another illustrative embodiment, the related phase information within the phase-related response is a timestamp corresponding to zero-crossing timing of a particular power-line of the polyphase power source system on which the end-point is located.

Illustratively, the techniques described herein may be performed by hardware, software, and/or firmware, such as in accordance with head-end application 248 and phase identification application 348 (e.g., with zero-crossing process 349), which may each contain computer executable instructions executed by the processor 220/320 to perform functions relating to the novel techniques described herein. It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process).

Figure 7:
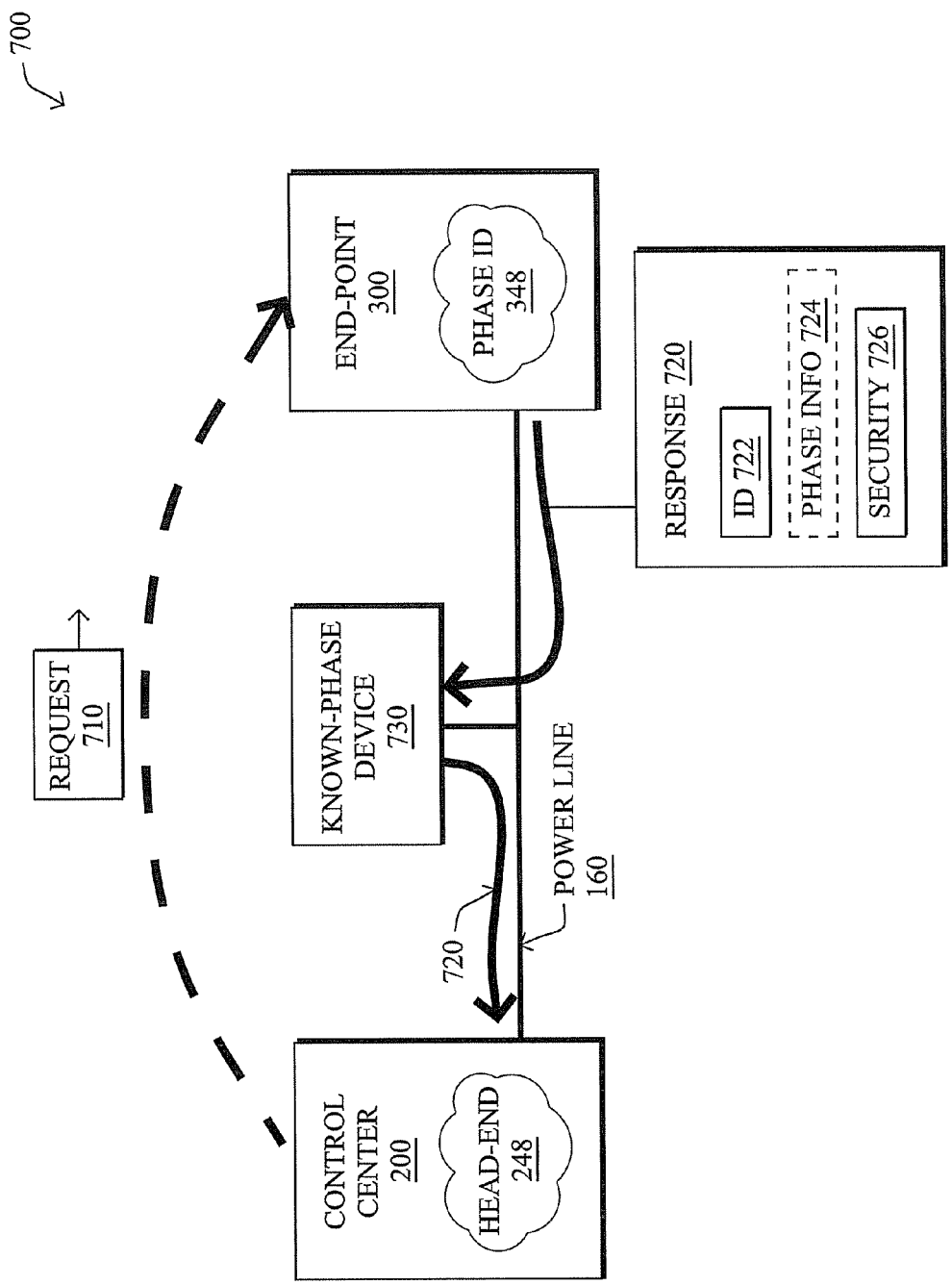
FIG. 7 illustrates a simplified example request/reply exchange for identifying end-point phase.

Operationally, FIG. 7 illustrates a simplified diagram of the first described embodiment. In particular, the head-end application 248 may transmit (e.g., broadcast, multicast, etc.) a request 710 to one or more end-point devices 300 that don't know their own phase in order to generate phase-related responses 720. The request may be manually triggered by a system administrator (e.g., on-demand), or else may be in response to any number of triggering events, such as timers (e.g., periodic), failure events, etc. Notably, the requests (polling) may be randomized to different end-points in order to avoid congestion in the system due to many end-points attempting to respond at the same time. For instance, a system in today's power grid environment may consist of six million end-points being powered at any given time.

Moreover, in a specific embodiment, the request message is sent as an out-of-band (OOB) request message over a secure channel, that is, on a transmission medium other than a power-line from which the end-point receives power. Out-of-band signaling can be used for high security (e.g., using a specific shared secret that can be sent to the end-point device, where the OOB communication verifies authentication), as well as for resiliency in case of failures (e.g., channel diversity). In the event that a specifically maintained security relationship exists with the end-points, then the phase-related response 720 may be configured to carry an associated security credential, as may be appreciated by those skilled in the art.

The end-point 300 may then return the phase-related response 720, which relays an identification 722 of the end-point and related phase information 724. Note that the information 724 is shown in phantom lines since the response 720 in this embodiment does not indicate an actual phase of the end-point, and, in fact, there may be no explicit information 724. That is, in this embodiment, the end-point is a power-line communication (PLC)-enabled device, and sends message (e.g., multicast) with its identification information 722, and optionally security credentials 726, over PLC into the utility network on the power-line 160. This message 720 is then intercepted by the utility devices 730 on that phase, where the devices 730 are associated with a known phase. In this manner, phase information of the given end-point that sent the response over PLC can be associated with a particular phase.

Said differently, the phase-related response 720 in this embodiment is a message transmitted on a particular power-line 160 of the polyphase power source system 100, where the related phase information "724" of the phase-related response is the fact that the message was transmitted on the particular power-line. As such, the phase information of the phase-related response can be correlated to a known phase of a known-phase device 730 through which the phase-related response was received over the corresponding particular power-line, and then the actual phase of the end-point can be identified based on the correlation.

FIGS. 8A-D illustrate example real-world scenarios within which the techniques described herein may be applied. For instance, in FIG. 8A, the head-end device 200 may comprise the head-end application 248 (e.g., a GIS application), and sends a request 710 (e.g., OOB, such as an IP message over a mesh network) to a smart meter 150 and/or home energy controller (HEC) 110. The response 720 may then be returned by the HEC 110 via the power-line to a known-phase device 730, e.g., a router. The phase information can then be sent back to the GIS (head-end application 248), where, since the known-phase device 730 is associated with a known phase, and since that particular known-phase device received a communication via the shared power-line (PLC), then the phase of the end-point devices (meter 150 and/or HEC 110) can be determined as the same phase of the corresponding known-phase device.

Figure 8A:
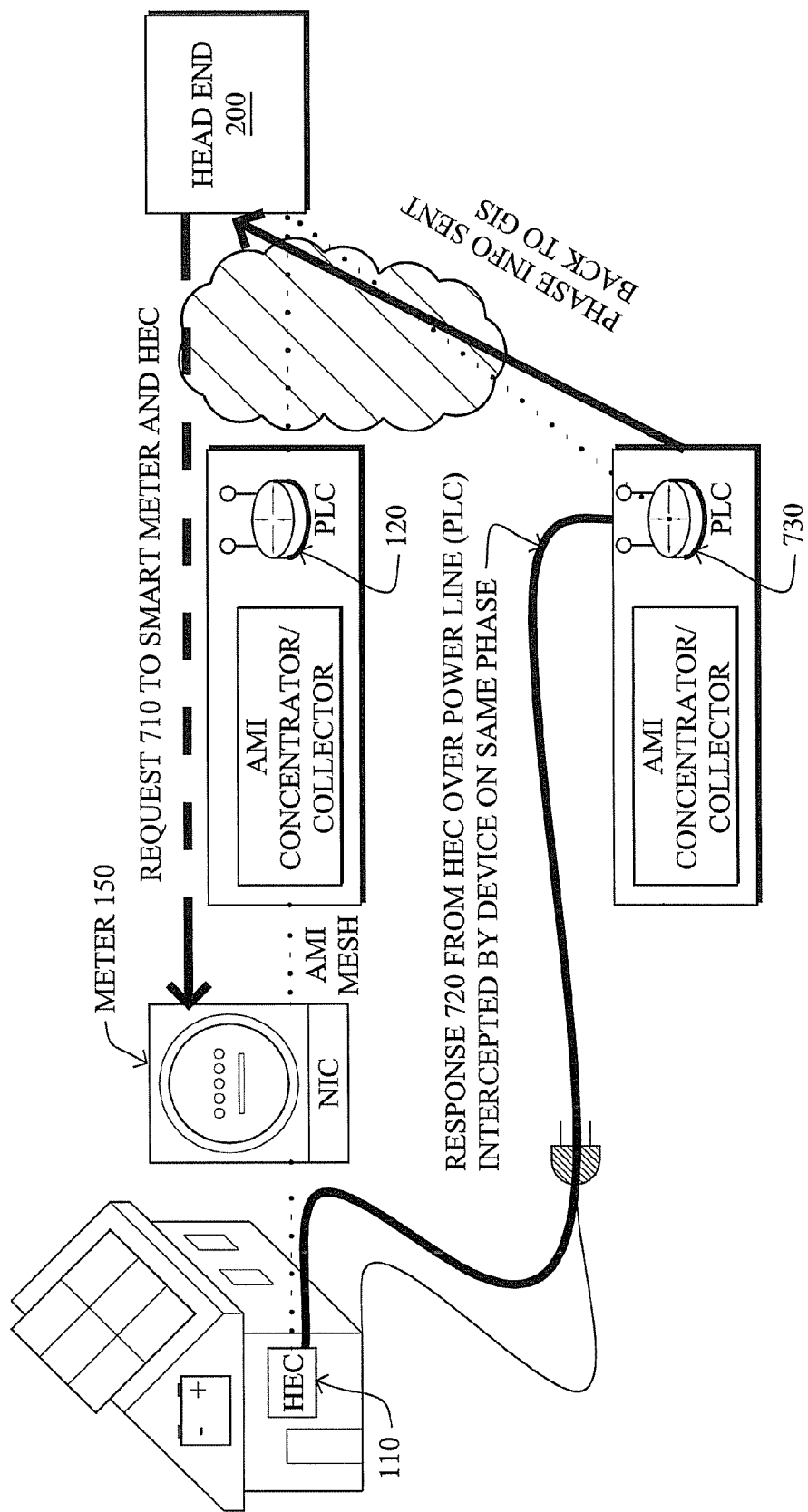
FIGS. 8A-D illustrate detailed example request/reply exchanges for identifying end-point phase.
Figure 8B:
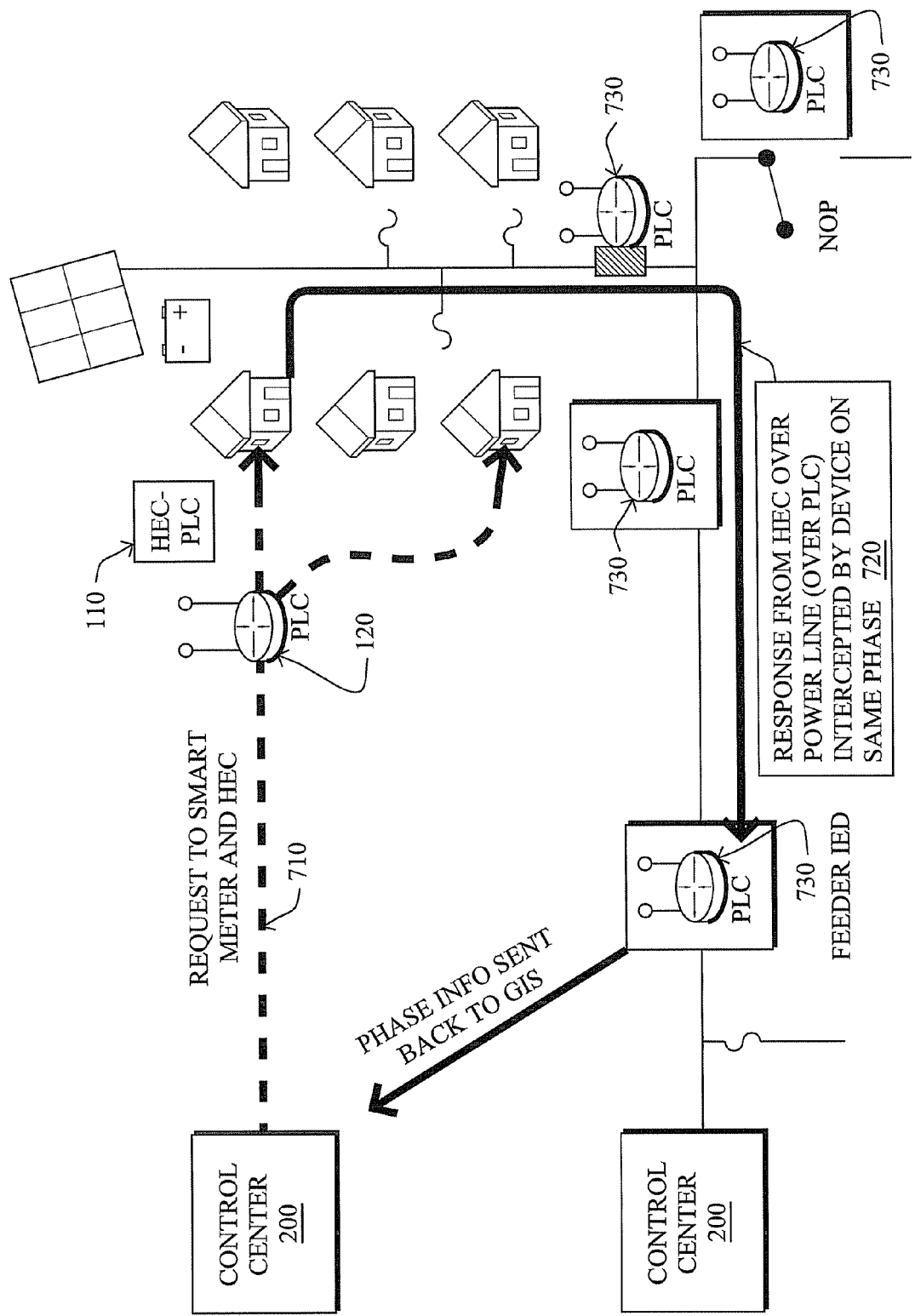

In an alternative view of FIG. 8A as shown in FIG. 8B, "laterals" (as understood in the art, e.g., a branch off from the grid connecting to the houses) may share a single phase that is distributed to respective transformers, while the "horizontal" circuit generally comprises a plurality of feeders on the multiple phases of the polyphase system (e.g., three phases). Again, the request 710 may be transmitted via various routers 120 to reach the PLC-enabled HECs 110, which then return their phase-related responses 720 via the power-line to be intercepted by devices on the same phased line. Note that the normally open point or "NOP" shown in the diagram illustrates provisions in the grid that may be used to repair downed power-lines, and which may result in a phase change after a power outage situation.

Figure 8C:
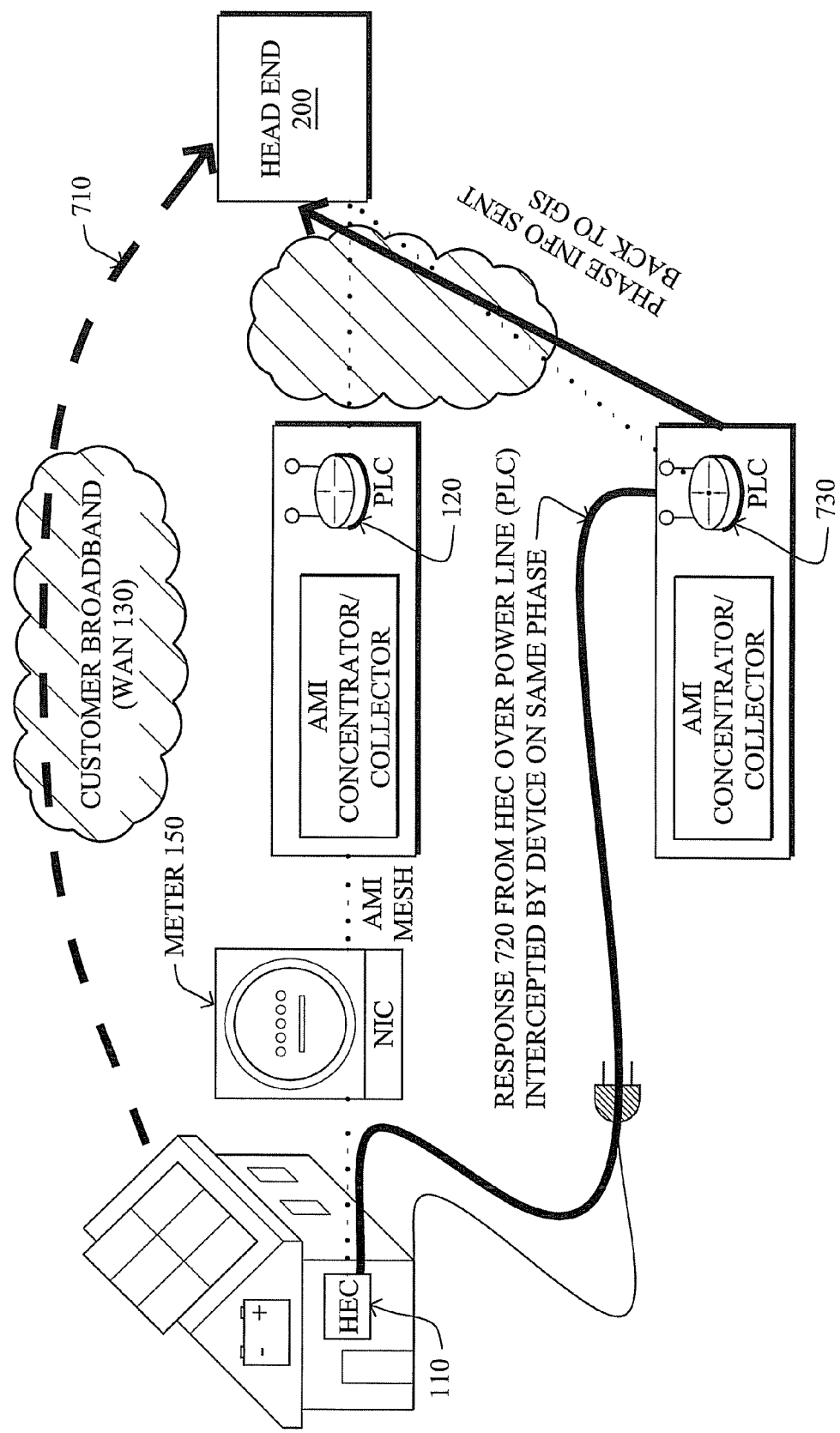

FIG. 8C illustrates another option, where the HEC 110 is connected to a customer's home broadband network, such as WAN 130 (e.g., to which the customer's computer 105 may be connected). As such, the request 710 may be transmitted via the WAN 130 directly to the HEC 110 without traversing the meter 150.

Figure 8D:
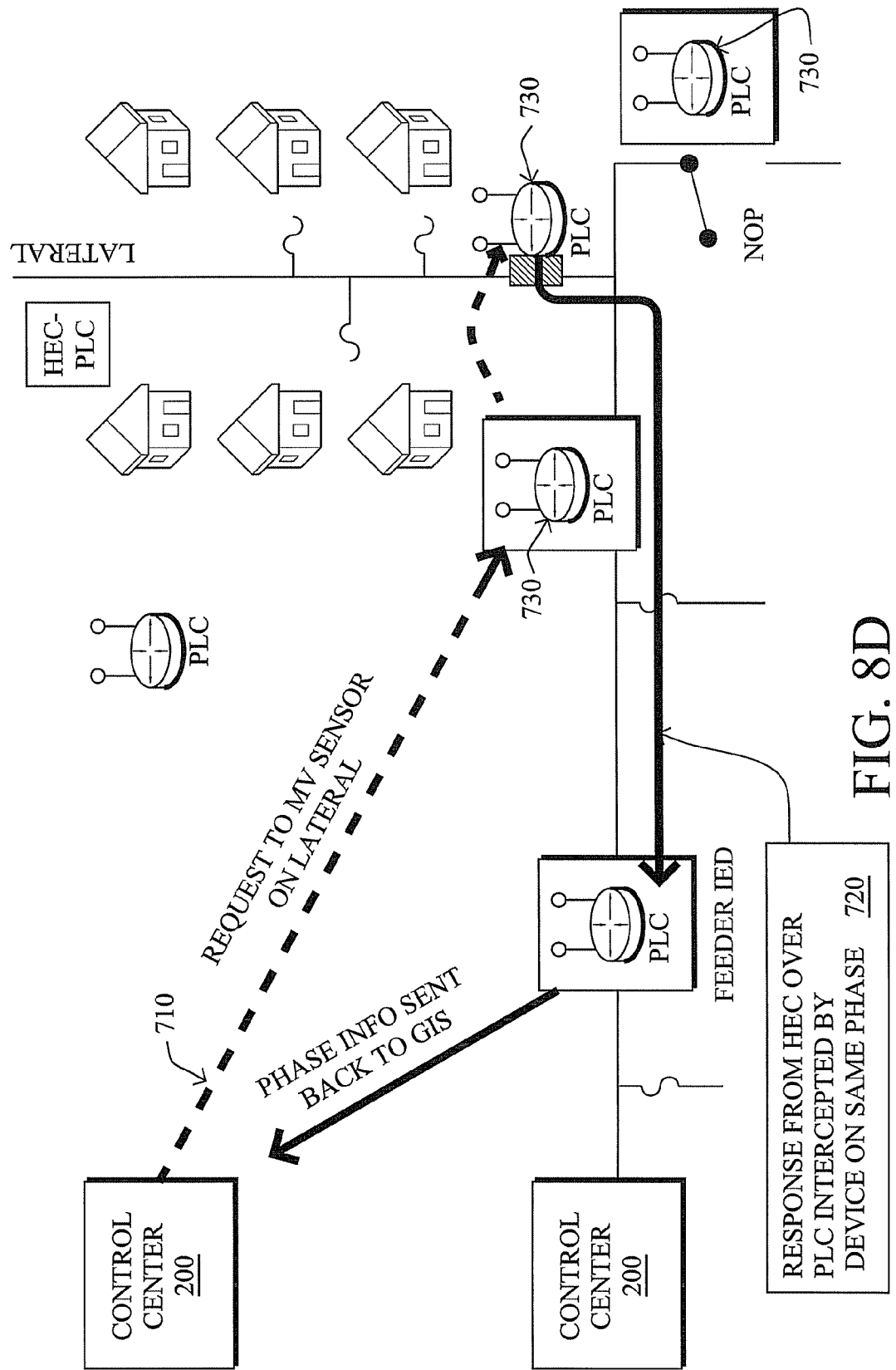

FIG. 8D illustrates the instance where the end-point is illustratively a sensor device, such as an MV sensor on the lateral. Similar to the HECs 110 acting as an end-point, the sensor receives the request 710, and returns an appropriate response 720 via PLC on the power-line.

Note that in each of FIG. 8A through FIG. 8D, it is important to note that the AMI mesh router 120 to which the meters 150 communicate may (though need not) be a different router than the known-phase router 730 on the PLC power-line. That is, the AMI router could be on a first phase (e.g., L1), while the PLC router on the power-line through which the responses 720 are received are on a second phase (e.g., L2).

With regard to the correlation mentioned above, FIG. 9 illustrates an example table 900 that may be used to facilitate the identification. In particular, the table 900, illustratively managed by head-end application 248, may comprise a plurality of entries consisting of known-phase devices 905, their associated phases 910, and unknown-phase devices 915. Based on which known-phase devices 730/905 (e.g., I, II, III) receive the PLC response 720, a correlation between the known-phase devices and unknown-phase devices (end-points 300, e.g., i, ii, iii, etc.) can be made (shown as the associated stored location within the table 900, though other correlations such as pointers, indexes, identification fields, etc., may be used). The identification of the phase for the unknown-phase devices is then taken from the associated known-phase device's phase.

In accordance with one or more additional embodiments, it may be possible to determine a hierarchy of end-points and known-phase devices in the polyphase power source system based on reception of phase-related responses on power-lines through particular devices. For instance, assume, as is often the case, that the power grid and associated devices on the grid are arranged in a hierarchical manner. In this case, it can be further assumed that as devices return their responses 720, that multiple "levels" of the underlying hierarchy may become apparent.

FIG. 10, for example, illustrates an extension to the table 900 that includes a new level of known-phase devices 1020/730, shown as AA, BB, CC, etc. In this instance, devices I, II, III, etc., may also report their phase information through PLC along the power-lines, at which time higher-level devices AA, BB, CC, etc., receive those associated responses. (Note that while the hierarchy shows unknown-phase devices as a single hierarchical level, multiple levels of unknown-phase devices may exist within the network 100.) Based on the continued amalgamation of responses through devices, a hierarchical "map" may be generated where each node or device creates a "list of children" that are further away from the control center 190 than the "parent" device. Such information may be particularly beneficial for maintaining scalability within the information reported to the central control station 190, or for other reasons such as management and/or control of specific groups of devices, accordingly. As an example, an illustrative network 100 may comprise six million end-points (e.g., HECs, sensors, etc.), while there may only be six thousand pole-top routers. Those pole-top routers may then be in communication with even fewer hierarchically higher routers on the way back to the head-end device 200 (or substation, etc.).

According to one or more specific embodiments, for identifying the phase information of a pole-top transformer 170, or other generally non-communicating device (or otherwise non-capable device), it is possible in specific circumstances to correlate satellite-based global positions (e.g., GPS coordinates) of the non-communicating device (e.g., pole-top transformer) with the GPS coordinates of the known-phase communicating device (e.g., router on the pole-top).

Figure 11:
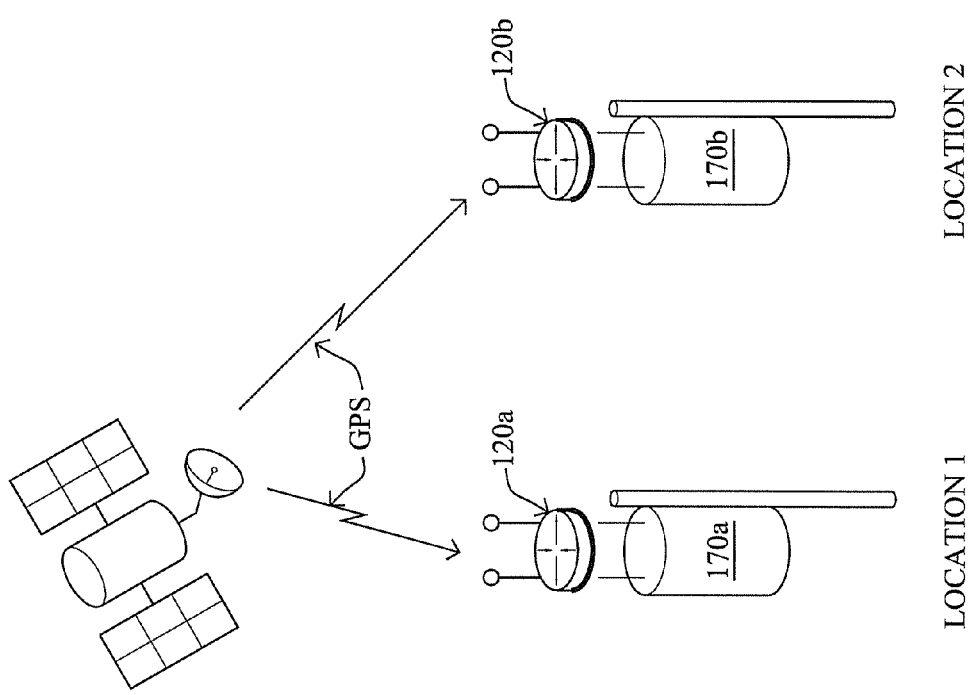
FIG. 11 illustrates an example of satellite-based global positioning.

FIG. 11 illustrates a simplified view of a satellite-based global positioning of the end-point, which may be a known-phase device as described above, or else a device for which the phase has since been determined, e.g., using the techniques herein. The locations of the pole-top transformer 170 may be known based on manual determination and data entry (e.g., a field technician with a hand-held GPS device), or else other techniques may be used. Pole-top end-points (e.g., routers 120), for which phase is either known or determined through the techniques herein, may determine their GPS location dynamically, and may report this information via communication to the control center 190.

Based on determining the satellite positioning of the devices, a new correlation table 1200 can be established as shown in FIG. 12 in order to allow for identification of co-located devices. As such, an assumed phase of a non-communicating device 1215 at location 1212 (e.g., a power device, such as a transformer) can be identified as the actual phase 1207 of the co-located end-point 1205 at the same location 1210. Hence, based on the example above, the phase information of a given pole-top transformer can be identified, and if there is a requirement to identify the phase information of every pole-top transformer, it can be obtained by placing a cooperating end-point (e.g., a pole-top router) on every desired pole-top transformer.

Note again that this example makes a very specific assumption that the communicating device is powered by the same phase of the non-communicating device in the same location. For instance, if it is known that a pole-top router is powered by a distribution transformer's secondary (as will be understood by those skilled in the art), then the assumption may be made that the pole-top router is on the same phase as the non-communicating transformer. However, if it is not known how the pole-top router is connected to the grid (e.g., through other various measures aside from the transformer's secondary), then he GPS correlation technique may be improper. In other words, while this correlation technique may be useful in certain situations with certain known or assumed factors, there are situations when it could be considered improper to base a phase identification solely on co-location with another device.

As an alternative to, or in addition to, the embodiments described above that use PLC to relay implicit phase information, the related phase information 724 within the phase-related response 720 may be explicit (though still not indicating an actual phase). In the illustrative embodiment herein, this explicit information may comprise a timestamp relating to when the alternating-current (AC) waveform (e.g., for voltage) crosses zero. That is, by monitoring the AC waveform of the electrical power source at the end-point devices (e.g., from its power supply 360), zero-crossing process 349 can determine/detect a time of a "zero-crossing" of the AC waveform, and can then generate a timestamp associated with that zero-crossing based on shared network timing.

Figure 13:
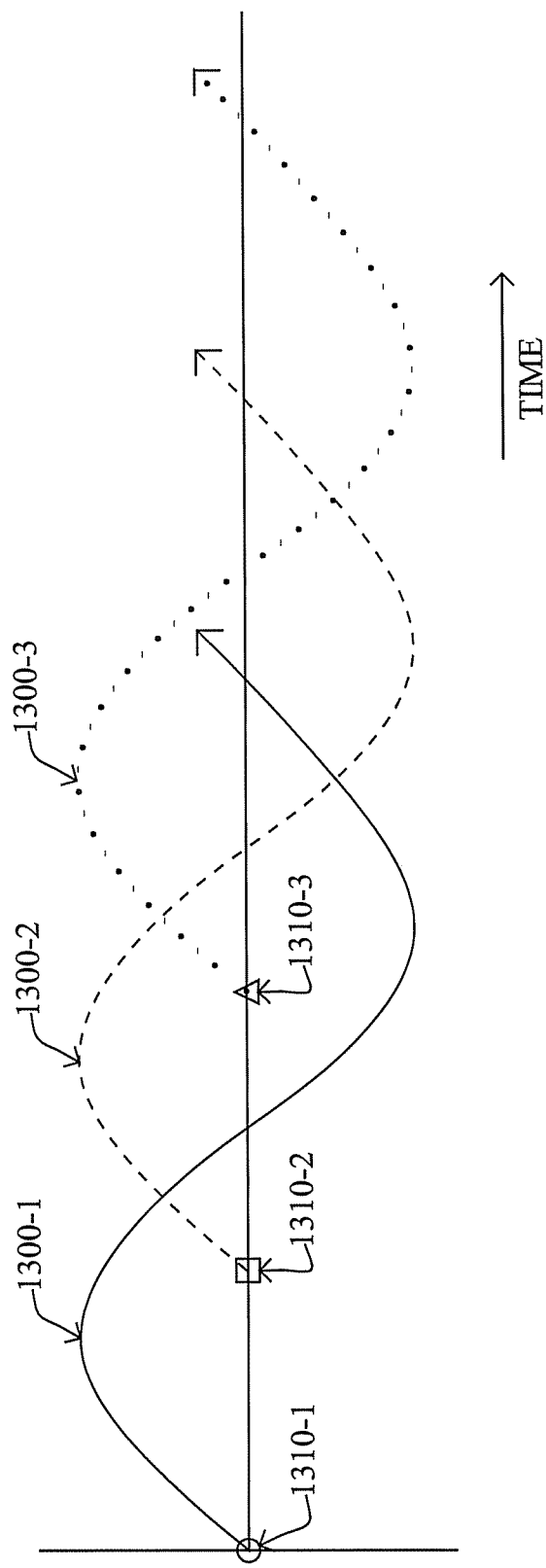
FIG. 13 illustrates an example alternating-current (AC) waveform for the polyphase electric distribution system.

For instance, as illustrated in FIG. 13, the usual form of an AC power circuit is a sine wave 1300. In a three-phase system, three circuit conductors carry three alternating currents (of the same frequency), L1 (1300-1), L2 (1300-2), and L3 (1300-3), which reach their instantaneous peak values at different times. For the sake of simplicity, the examples herein ignore the neutral wire which is used in many topologies. Taking one sine wave of conductor (L1) as the reference, the other two sine waves are delayed in time by one-third (L2) and two-thirds (L3) of one cycle of the electric current. Note that each single-phase waveform goes to zero at each moment that the voltage crosses zero. The illustrative technique determines these "zero-crossings" 1310, such as each time the wave crosses zero, or more particularly as shown, each time the wave increases through zero (or alternatively decreases through zero).

Each device (with a zero-crossing process 349) can determine the timing of its waveforms zero crossings, either 1310-1, 1310-2, or 1310-3, corresponding to the power received from the particular power-line 160 of the polyphase power source system 100 on which the end-point is located. With the determined zero crossing, the end-point device then needs to correlate this time (these times) with a global reference clock. According to the illustrative technique, such a timestamp may be based on shared network timing information, e.g., with an accuracy of 1-2 ms, such as through the known NTPv4 or IEEE 1588v2 protocols.

Figure 14:
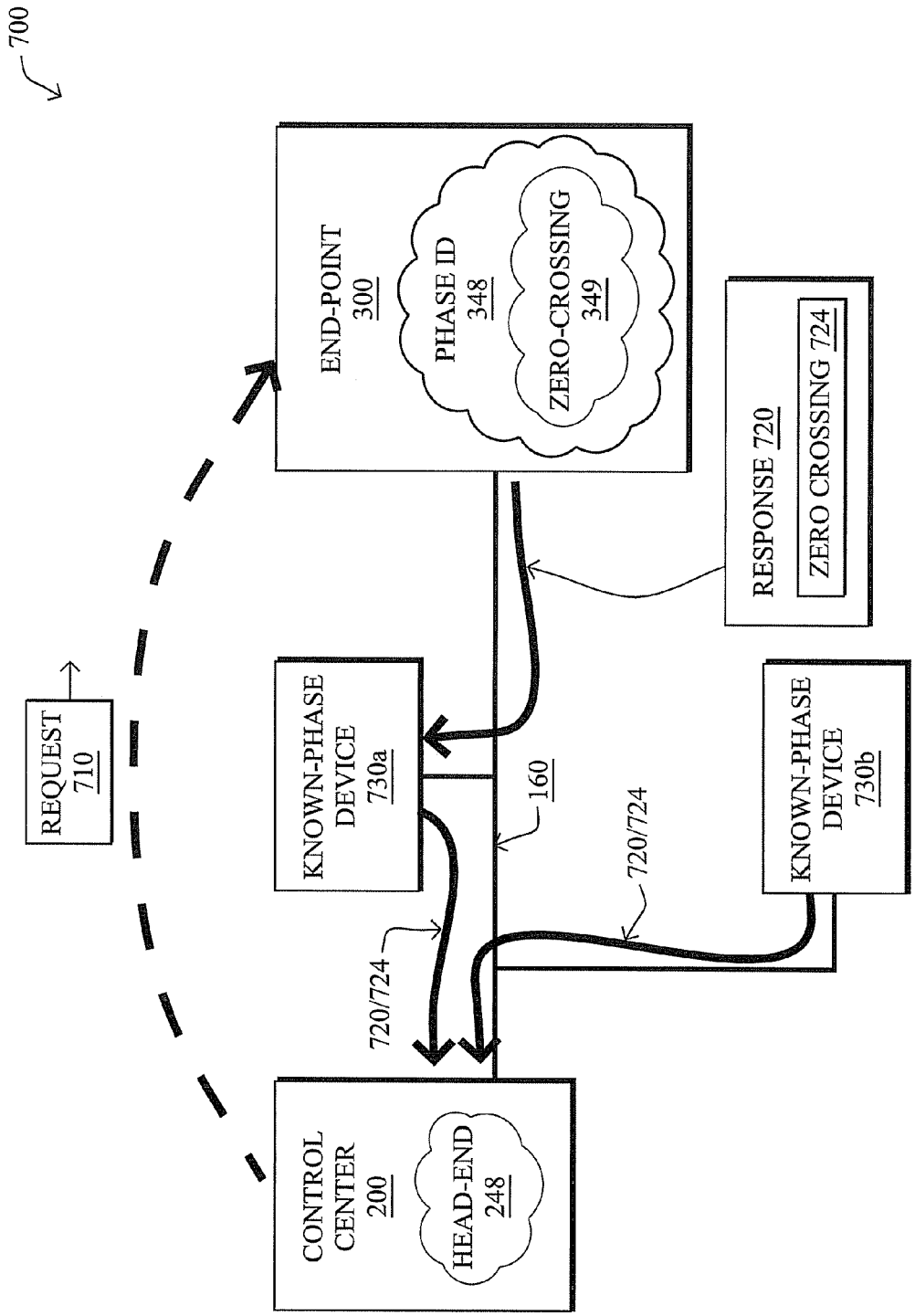
FIG. 14 illustrates another simplified example request/reply exchange for identifying end-point phase.

FIG. 14 illustrates a simplified diagram of this particular embodiment. For example, the head-end application 248 may again signal end-points 300 (e.g., using OOB signaling) to send a request 710 for phase information. The end-point may then determine (or may already have determined) its zero-crossings based on making the appropriate voltage measurements described above, and the associated (and accurate) timestamp. This zero-crossing information (related phase information 724) is then sent back to the head-end application 248 or other intermediate substation in a response 720. Similarly, the zero-crossing information for known-phase devices 730a or 730b (illustrating that the known-phase device need not be located in a direct path on the same power-line 160) may also be returned to the head-end. Note that the response 720 in this embodiment may follow PLC communication as it did above, or else the information may be sent using other communication channels, such as mesh communication, broadband, etc.

The collected data at the head-end may be stored, such as in a table 1500 as shown in FIG. 15, such that comparisons of the zero-crossing information of the three phases can be made to provide the phase information for the different end-points. For instance, known-phase devices 1505 and their associated phases 1510 may now further be correlated to zero-crossing timing 1515 (e.g., T1, T2, etc.). In addition, zero-crossing timings 1520 for unknown-phase end-points 1525 may be stored, such that the head-end application 248 can determine a particular known-phase device 1505 having a corresponding timestamp for its zero-crossing timing to identifying the actual phase of the end-point 1525, i.e., as the known phase of the particular known-phase device. As an example, all devices with a zero-crossing timing of "T1" may be classified as devices that share the same phase, and hence may be correlated to a known-phase device's phase that shares the same zero-crossing timing. Note that while a certain format is shown for table 1500, such a format is merely illustrative, and is not meant to limit the scope of the embodiments herein. For example, other correlation techniques between stored data may be used, such as pointers, indexes, etc., and the view shown herein is merely an example.

Note also that while the zero-crossings are shown as direct matches (T1=T1, T2=T2, etc.), the zero-crossing correlation may actually be based on the periodicity of the phase. That is, while a particular timestamp may indicate a precise time at which the voltage crossed zero, the waveform of the power continually crosses zero (e.g., at a 50 or 60 Hz frequency). Accordingly, correlations between zero-crossing times can be deduced by extending the waveform's periodic zero-crossing occurrence, such that "T1" as a zero-crossing may correspond to any time that is T1+/−a whole-number multiple of the wavelength.

Generally, the techniques described above may be used by head-end applications 248 (e.g., GIS applications) to create a utility asset connectivity diagram in a variety of circumstances. For instance, in addition to an initial assessment of phase allocation, periodic polling (e.g., one per day) may be used to revise the connectivity information. Further, the techniques above may be implemented in response to potential changes in the system, such as after an outage restoration to update new connectivity information (e.g., downed power-lines, etc.), or after a new asset (e.g., end-points, or more specifically, grid equipment such as transformers, generators, etc.). Note also that the information may be particularly beneficial for phase-based control of systems, such as demand responses (DRs) in response to shifting phase, brown-out conditions, etc.

Figure 16:
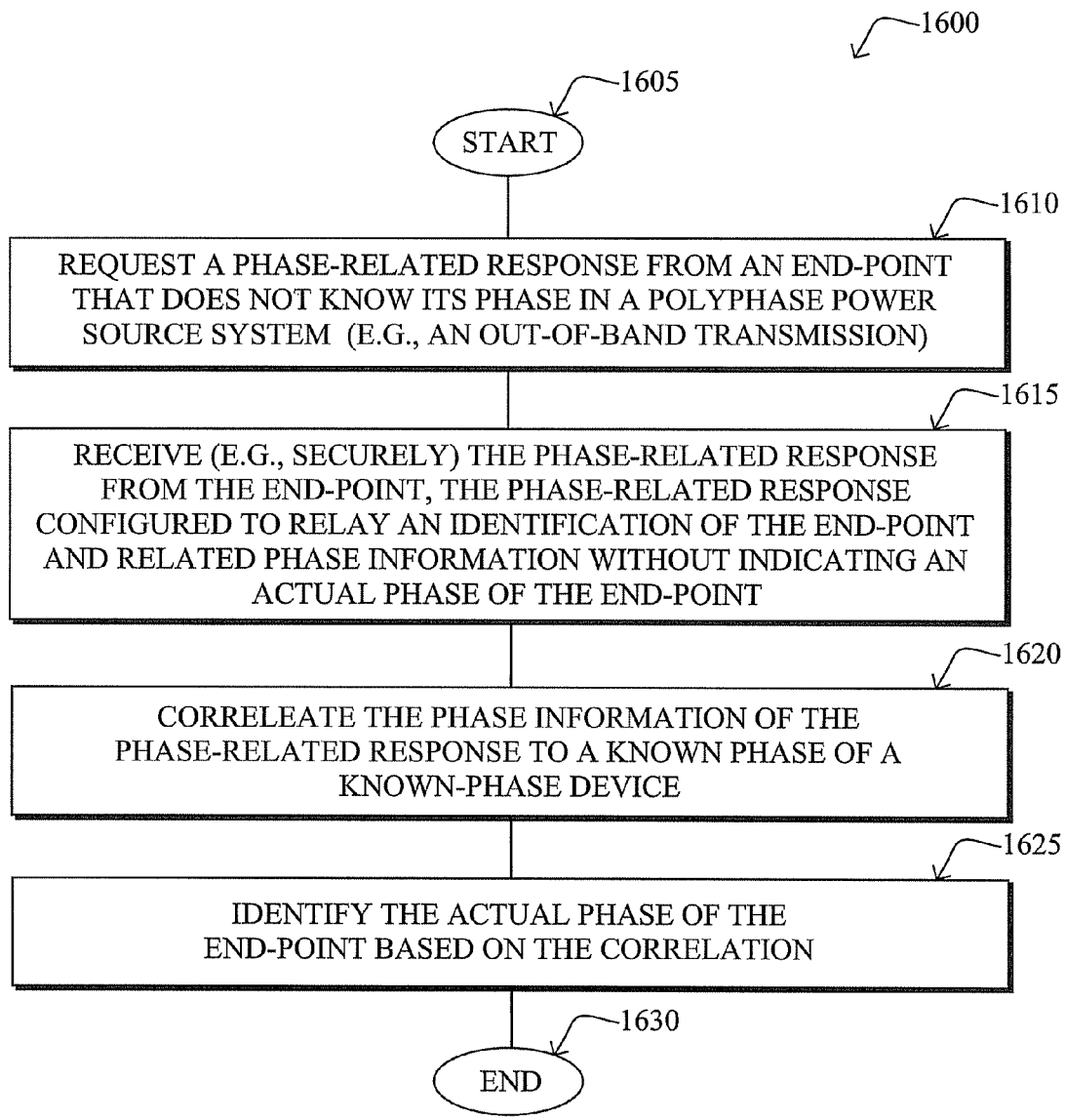
FIG. 16 illustrates an example simplified procedure for identifying end-point phase, from the perspective of the requestor.

FIG. 16 illustrates an example simplified procedure for identifying end-point phase in accordance with one or more embodiments described herein, from the perspective of the requestor (e.g., head-end node 200/application 248). The procedure 1600 starts at step 1605, and continues to step 1610, where, as described in greater detail above, a phase-related response is requested from at least one end-point 300 (e.g., one, all, or a subset of all end-points, as noted above) that does not know its phase in a polyphase power source system. In one embodiment as described above, such a request may consist of an out-of-band transmission 710.

The requestor may then in step 1615 receive (e.g., via a secure communication channel) the phase-related response 720 from the end-point 300, where the phase-related response, as described above, is configured to relay an identification 722 of the end-point and related phase information 724 without indicating an actual phase of the end-point. (Note that FIGS. 17 and 18 below describe specific sub-procedures corresponding to embodiments of the related phase information mentioned herein.) In step 1620, the phase information of the phase-related response 720 is correlated to a known phase of a known-phase device 730 (e.g., 730a or 730b), such than an identification may be made in step 1625 to the actual phase of the end-point. The illustrative procedure 1600 for identifying end-point phase ends in step 1630.

Figure 17:
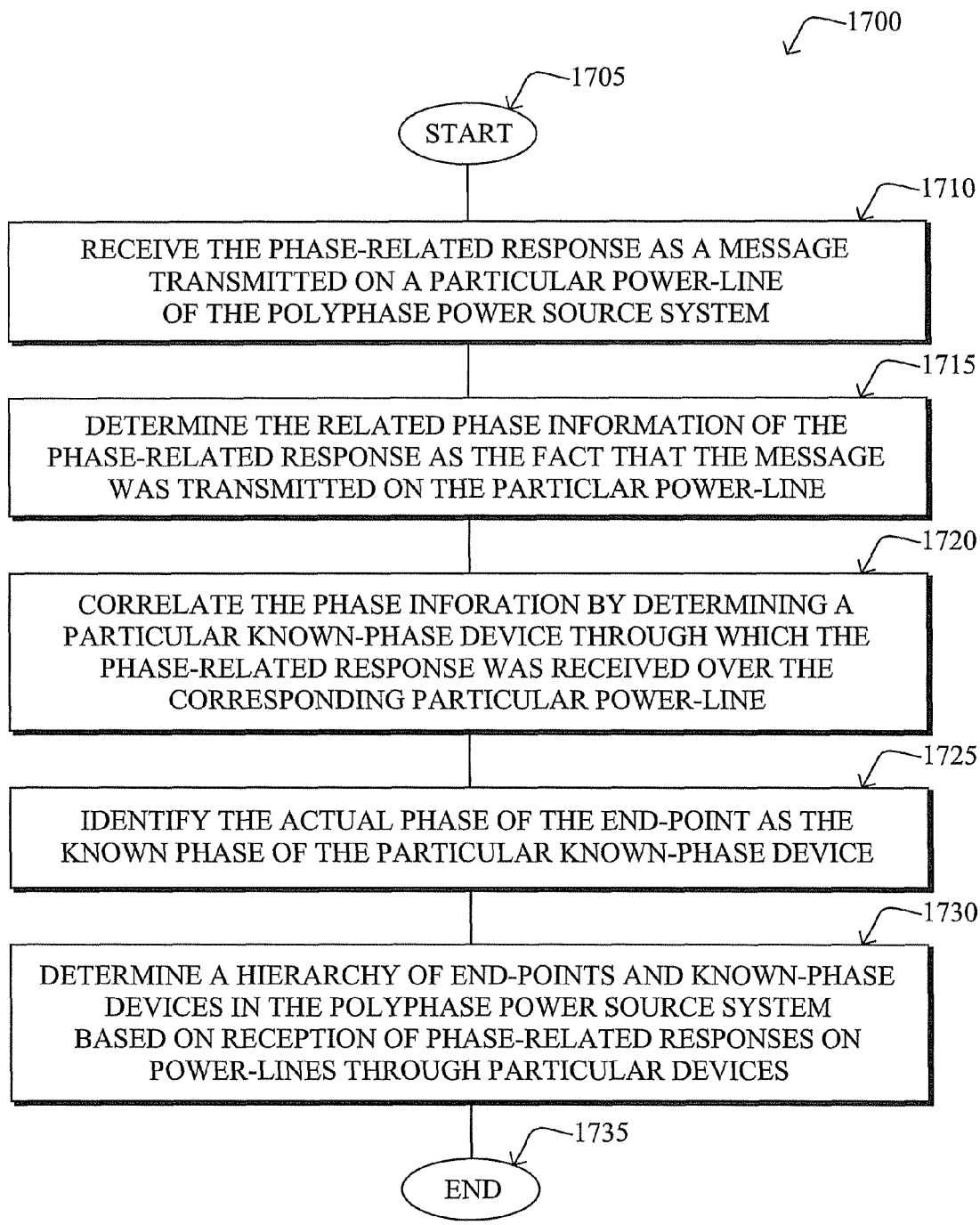
FIG. 17 illustrates an example simplified sub-procedure for identifying end-point phase, e.g., when power-line locating is used.

As noted, FIG. 17 illustrates an example simplified sub-procedure for identifying end-point phase in accordance with one or more embodiments described herein, e.g., in relation generally to steps 1615-1630 above when power-line locating is used. The (sub-) procedure 1700 starts at step 1705, and continues to step 1710, where the received phase-related response 720 is a message 820 transmitted on a particular power-line 160 of the polyphase power source system. As described in detail above, in step 1715 the related phase information of the phase-related response is determined by the fact that the message was transmitted on the particular power-line. Accordingly, in step 1720, the phase information for the end-point may be correlated by determining a particular known-phase device 730a through which the phase-related response was received over the corresponding particular power-line, and thus in step 1725 the actual phase of the end-point can be identified as the known phase of the particular known-phase device (e.g., as shown in FIG. 9 above). Note further, that as described with reference to FIG. 10 above, in step 1730 a hierarchy of end-points and known-phase devices in the polyphase power source system can be determined based on reception of phase-related responses on power-lines through particular devices. The sub-procedure 1700 may then end in step 1735.

Figure 18:
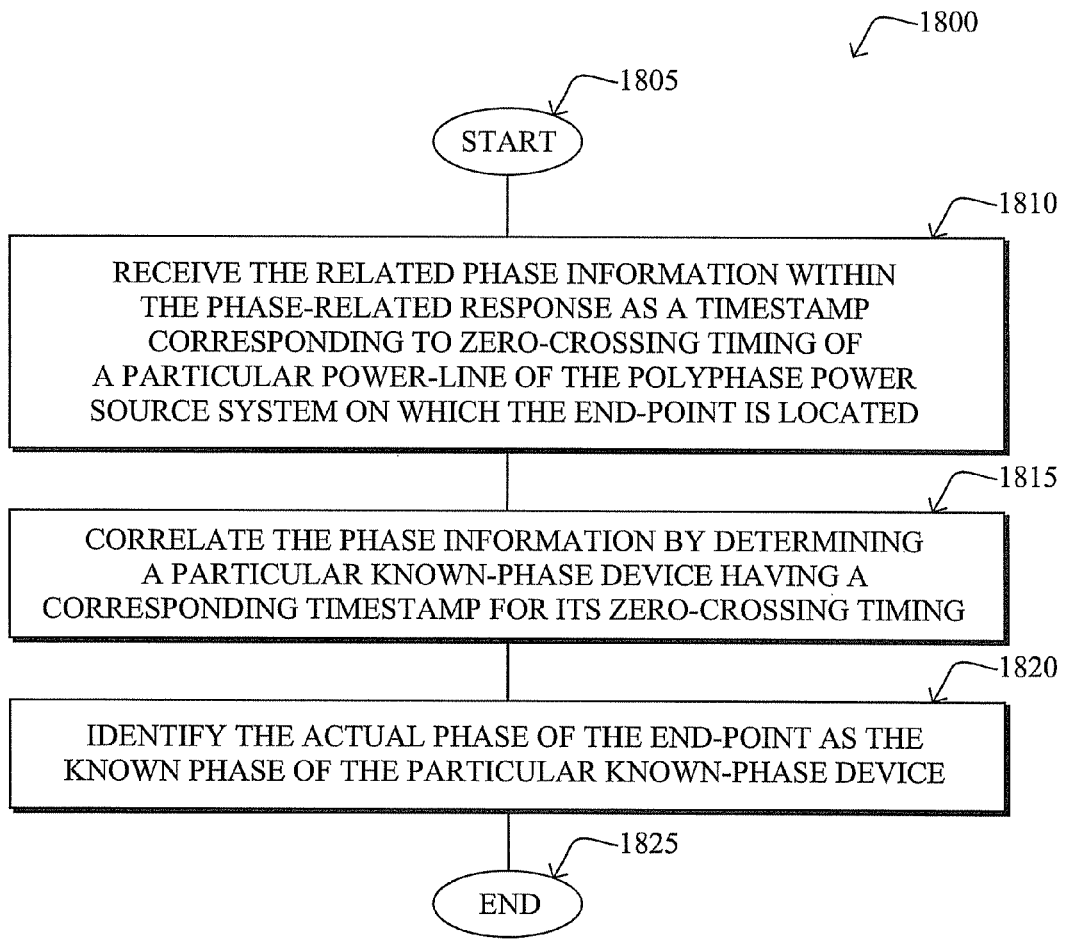
FIG. 18 illustrates another example simplified sub-procedure for identifying end-point phase, e.g., when zero-crossing timing is used.

Also, FIG. 18 illustrates another example simplified sub-procedure for identifying end-point phase in accordance with one or more embodiments described herein, e.g., in relation generally to steps 1615-1630 above when zero-crossing timing is used. The (sub-) procedure 1800 starts at step 1805, and continues to step 1810, where the received related phase information 724 within the phase-related response 720 is a timestamp corresponding to timing of a zero-crossing 1310 of a particular power-line of the polyphase power source system on which the end-point is located. By then correlating the phase information through determining a particular known-phase device having a corresponding timestamp for its zero-crossing timing in step 1815, then in step 1820 the actual phase of the end-point may be identified as the known phase of the particular known-phase device (e.g., as described with reference to FIG. 15 above). The sub-procedure 1800 ends in step 1825.

Figure 19:
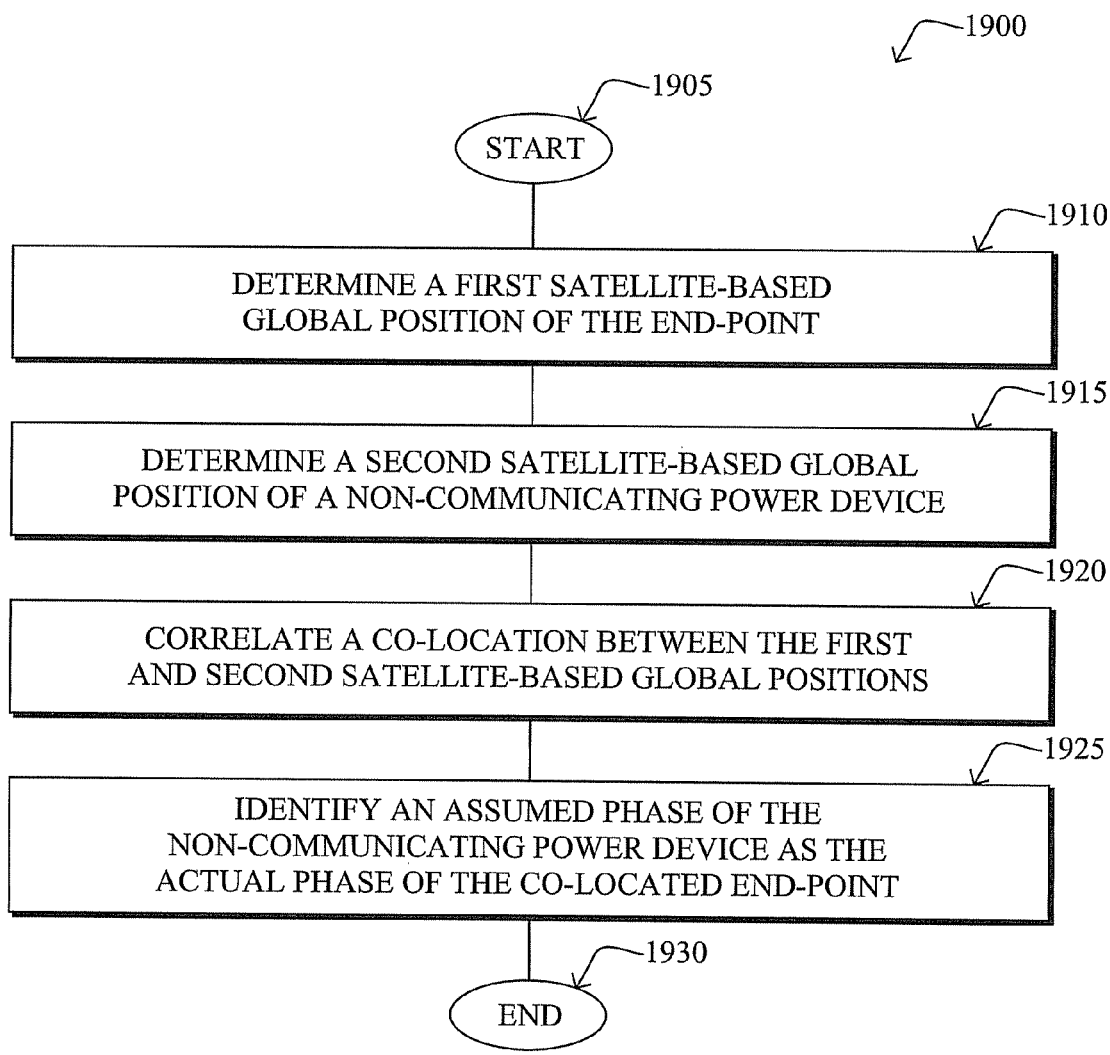
FIG. 19 illustrates an example simplified procedure for GPS-based phase determination of non-communicating devices.

Additionally, FIG. 19 illustrates an example simplified procedure for GPS-based phase determination of non-communicating devices in accordance with one or more embodiments described herein, e.g., based on the specific knowledge/assumption that co-located devices are configured to interconnect with the same phase. The procedure 1900 starts at step 1905, and continues to step 1910, where, as described above, a first satellite-based global position of the end-point is determined (e.g., pole-top router 1120*a*), and then to step 1915, where a second satellite-based global position of a non-communicating power device (e.g., transformer 170, such as 1170*a*) is also determined. (Note that the order of steps 1910 and 1915 is interchangeable.) Based on the first and second satellite-based global positions, and based on the specific conditions where a correlation of this nature is not improper, in step 1920 the co-location there-between may be correlated, such that in step 1925, an assumed phase of the non-communicating power device may be identified as the actual phase of the co-located end-point. The procedure 1900 ends in step 1930.

Figure 20:
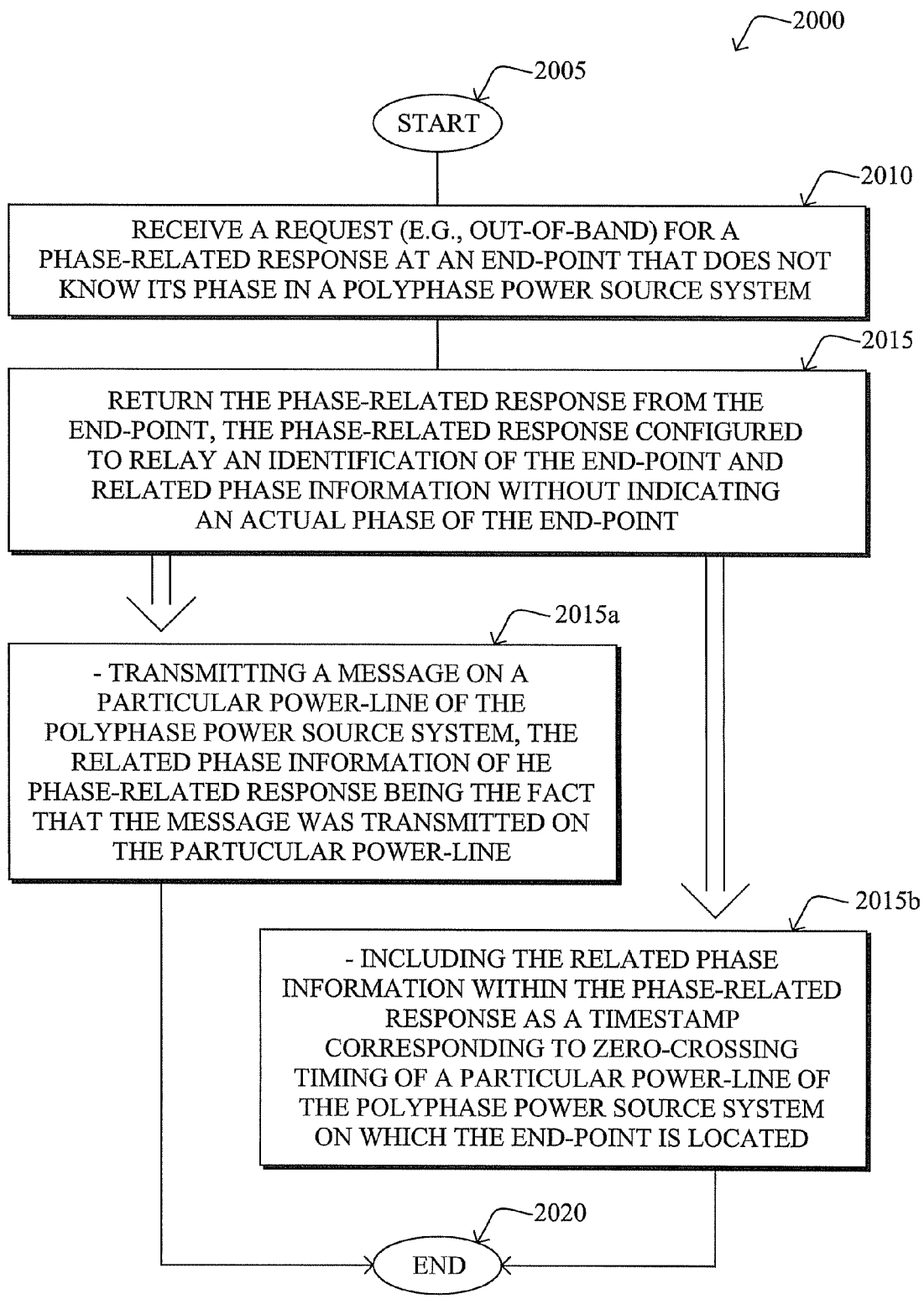
FIG. 20 illustrates an example simplified procedure for end-point phase identification, from the perspective of the end-point itself.

Lastly, FIG. 20 illustrates an example simplified procedure for end-point phase identification in accordance with one or more embodiments described herein, from the perspective of the end-point itself. The procedure 2000 starts at step 2005, and continues to step 2010, where, as described above, the end-point 300, which does not know its phase in a polyphase power source system, receives a request 710 (e.g., out-of-band) for a phase-related response. Accordingly, in step 2015, the end-point may return the phase-related response 720, which relays an identification 722 of the end-point and related phase information 724 without indicating an actual phase of the end-point. For instance, as described above, the related phase information 724 may be based on transmitting a message 820 on a particular power-line 160 of the polyphase power source system as in sub-step 2015*a*, i.e., on a particular phase of the three phase feeder, and the related phase information of the phase-related response is simply the fact that the message was transmitted on the particular power-line (and, more particularly, that it is received by a known-phase device on that same-phased power-line). Alternatively, as shown in sub-step 2015*b*, the related phase information may be included within the phase-related response as a timestamp corresponding to zero-crossing timing of the particular power-line on which the end-point is located. Note that inherent within step 2015*b* is the determination of the zero-crossing timing by the end-point 300, accordingly. The procedure 2000 ends in step 2020.

It should be noted that while certain steps within procedures 1600-2000 may be optional as described above, the steps shown in FIG. 16 through FIG. 20 are merely examples for illustration, and certain steps may be included or excluded as desired. Further, while procedures 1600-2000 are described separately, certain steps from each procedure may be incorporated into each other procedure, and the procedures are not meant to be mutually exclusive.

The novel techniques described herein, therefore, provide for phase identification of devices in a polyphase electric system. In particular, the novel techniques allow a utility to poll phase information for different end-points like customers, sensors, and pole-top transformers. For example, the techniques herein provide utilities with access to accurate electrical topology (connectivity) information at any given time using a secure "plug-n-play" architecture, including detailed phase information about the distribution circuit, lateral connections, and customer connections. This is particularly useful for feeder reconfiguration, distribution power flow analysis, outage analysis, etc. Further, the techniques above provide functionality that would be difficult, if not practically impossible, to perform manually, such as the hierarchical maps, which are critical for large scale deployments (e.g., with tens of millions of nodes in a network).

In addition, the techniques herein provide a PLC-based solution, with the ability to propagate through transformers, which is in contrast with Broadband over Power Line (BPL) solutions that need transformer bypasses. That is, BPL-based solutions (high frequency communication) propagate poorly through distribution transformers, thus forcing utilities to deploy a BPL node at every pole-top transformer to bypass the distribution transformer to obtain connection to the distribution secondary and the load. The techniques herein do not need to have a collector on every pole-top transformer as it can utilize low frequency PLC technology that is able to propagate through transformers and over much longer distances between repeaters on MV circuits than BPL can provide. As such, the techniques herein are a cost effective solution.

Moreover, there is no need in the embodiments described herein to manually determine the location and/or phase of transformers or routers to which end-points are connected. In particular, the techniques herein alleviate the need for costly and cumbersome manual processes, for example, by propagating the information through transformers, and aggregating PLC signals at substations (or other aggregation sites) where the phase information is well known and/or easy to monitor. This feature also makes the techniques herein less prone to errors associated with feeder reconfigurations, and provides a basis for the hierarchical architecture for requestors/collectors, as mentioned above. Note further, that without this hierarchical architecture, a single point of failure would exist, which may be particularly subject to security attacks.

While there have been shown and described illustrative embodiments that provide for phase identification of devices in a polyphase electric system, it is to be understood that various other adaptations and modifications may be made within the spirit and scope of the embodiments herein. For example, the embodiments have been shown and described herein with relation to particular communication protocols. However, the embodiments in their broader sense are not as limited, and may, in fact, be used with other types of networks and/or protocols. Also, while the embodiments above generally describe the polyphase source system as a three-phase system, this is merely one example embodiment of a polyphase system (granted, the most prevalent type today), and is not meant to limit the embodiments herein. In addition, as noted above, while the techniques above may be made reference to transmission systems or distribution systems, however the disclosure herein applies to both the transmission and distribution portions of the electric grid, where applicable.

Furthermore, while the embodiments described above generally reference a single requestor device (head-end management device) initiating the request the phase information collection, the techniques herein allow for the end-points to initiate the collection of phase information. For instance, an end-point device may be interested to know its own phase for various reasons, such as for network-based control (e.g., joining particular sub-networks), or for responding to certain higher-level application requests, and so on.

Still further, while reference to zero crossings has generally been made to zero crossing of the associated voltage waveforms, the embodiments herein are not so limited. In particular, under certain situations, the current waveform may also be used to monitor for zero crossings. However, as those skilled in the art will appreciate, the current waveforms often undergo phase shifts that are dependent on unknown line and load parameters, and as such, may be less accurate for use as a comparison with known-phase devices. (Note that voltage waveforms also undergo phase shifts based on line parameters, but these are quite small.)

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method, comprising:
   requesting a phase-related response from an end-point that does not know its phase in a polyphase power source system;
   receiving the phase-related response from the end-point, the phase-related response configured to relay an identification of the end-point and related phase information without indicating an actual phase of the end-point;
   correlating the phase information of the phase-related response to a known phase of a known-phase device; and
   identifying the actual phase of the end-point based on the correlation, wherein
      the phase-related response is a message transmitted on a particular power-line of the polyphase power source system, the related phase information of the phase-related response being the fact that the message was transmitted on the particular power-line.

2. The method as in claim 1, further comprising:
   correlating the phase information by determining a particular known-phase device through which the phase-related response was received over the corresponding particular power-line; and
   identifying the actual phase of the end-point as the known phase of the particular known-phase device.

3. The method as in claim 2, further comprising:
   determining a hierarchy of end-points and known-phase devices in the polyphase power source system based on reception of phase-related responses on power-lines through particular devices.

4. The method as in claim 1, wherein the related phase information within the phase-related response includes a timestamp corresponding to zero-crossing timing of a particular power-line of the polyphase power source system on which the end-point is located, the method further comprising:
   correlating the phase information by determining a particular known-phase device having a corresponding timestamp for its zero-crossing timing; and
   identifying the actual phase of the end-point as the known phase of the particular known-phase device.

5. The method as in claim 4, wherein the timestamp is based on shared network timing information.

6. The method as in claim 1, further comprising:
   maintaining a security relationship with the end-point, wherein the phase-related response carries a security credential.

7. The method as in claim 1, wherein requesting the phase-related response comprises:
   transmitting an out-of-band (OOB) request to the end-point, wherein the OOB request is transmitted on a transmission medium other than a power-line from which the end-point receives power.

8. The method as in claim 1, further comprising:
   determining a first satellite-based global position of the end-point;
   determining a second satellite-based global position of a non-communicating power device;
   correlating a co-location between the first and second satellite-based global positions; and
   identifying an assumed phase of the non-communicating power device as the actual phase of the co-located end-point.

9. A tangible, non-transitory, computer-readable media having software encoded thereon, the software when executed by a processor on a device in a computer network operable to:
   request a phase-related response from an end-point that does not know its phase in a polyphase power source system;
   receive the phase-related response from the end-point, the phase-related response configured to relay an identification of the end-point and related phase information without indicating an actual phase of the end-point;
   correlate the phase information of the phase-related response to a known phase of a known-phase device; and
   identify the actual phase of the end-point based on the correlation, wherein
      the phase-related response is a message transmitted on a particular power-line of the polyphase power source system, the related phase information of the phase-related response being the fact that the message was transmitted on the particular power-line.

10. The computer-readable media as in claim 9, wherein the software when executed is further operable to:
    correlate the phase information by determining a particular known-phase device through which the phase-related response was received over the corresponding particular power-line; and
    identify the actual phase of the end-point as the known phase of the particular known-phase device.

11. The computer-readable media as in claim 9, wherein the related phase information within the phase-related response includes a timestamp corresponding to zero-crossing timing of a particular power-line of the polyphase power source system on which the end-point is located, and wherein the software when executed is further operable to:
    correlate the phase information by determining a particular known-phase device having a corresponding timestamp for its zero-crossing timing; and identify the actual phase of the end-point as the known phase of the particular known-phase device.

12. The computer-readable media as in claim 9, wherein the software when executed to request the phase-related response is further operable to:
transmit an out-of-band (OOB) request to the end-point, wherein the OOB request is transmitted on a transmission medium other than a power-line from which the end-point receives power.

13. The computer-readable media as in claim 9, wherein the software when executed is further operable to:
determine a first satellite-based global position of the end-point;
determine a second satellite-based global position of a non-communicating power device;
correlate a co-location between the first and second satellite-based global positions; and
identify an assumed phase of the non-communicating power device as the actual phase of the co-located end-point.

14. A method, comprising:
receiving a request for a phase-related response at an end-point that does not know its phase in a polyphase power source system; and
returning the phase-related response from the end-point, the phase-related response configured to relay an identification of the end-point and related phase information without indicating an actual phase of the end-point, wherein
the phase-related response is a message transmitted on a particular power-line of the polyphase power source system, the related phase information of the phase-related response being the fact that the message was transmitted on the particular power-line.

15. The method as in claim 14, wherein returning the phase-related response comprises:
including a timestamp in the related phase information within the phase-related response, the timestamp corresponding to zero-crossing timing of a particular power-line of the polyphase power source system on which the end-point is located.

16. The method as in claim 14, further comprising:
maintaining a security relationship with a requestor of the phase-related response, wherein the phase-related response carries a security credential.

17. The method as in claim 14, wherein receiving the request for the phase-related response comprises:
receiving an out-of-band (OOB) request at the end-point, wherein the OOB request is transmitted on a transmission medium other than a power-line from which the end-point receives power.

18. An apparatus, comprising:
a power supply adapted to receive an alternating-current (AC) waveform of an electrical power source, the power source being part of a polyphase power source system, wherein the apparatus does not know its phase in the polyphase power source system;
a network interface adapted to communicate in a computer network;
a processor coupled to the network interface and adapted to execute one or more processes; and
a memory configured to store a process executable by the processor, the process when executed operable to:
receive a request for a phase-related response from a requestor; and
return the phase-related response to the requestor, the phase-related response configured to relay an identification of the apparatus and related phase information without indicating an actual phase of the apparatus, wherein
the phase-related response is a message transmitted on a particular power-line of the polyphase power source system, the related phase information of the phase-related response being the fact that the message was transmitted on the particular power-line.

19. The apparatus as in claim 18, wherein the process when executed to return the phase-related response is further operable to:
include a timestamp in in the related phase information within the phase-related response, the timestamp corresponding to zero-crossing timing of a particular power-line of the polyphase power source system on which the apparatus is located.

20. The apparatus as in claim 18, wherein the process when executed is further operable to:
maintain a security relationship with the requestor of the phase-related response, wherein the phase-related response carries a security credential.

21. The apparatus as in claim 18, wherein the process when executed to receive the request for the phase-related response is further operable to:
receive an out-of-band (OOB) request, wherein the OOB request is transmitted on a transmission medium other than a power-line from which the apparatus receives power.

* * * * *